United States Patent
Yu et al.

(10) Patent No.: US 10,868,137 B2
(45) Date of Patent: Dec. 15, 2020

(54) SEMICONDUCTOR DEVICE AND METHOD

(71) Applicant: Taiwan Semiconductor Manufacturing Company, Ltd., Hsinchu (TW)

(72) Inventors: De-Wei Yu, Ping-tung (TW); Cheng-Po Chau, Tainan (TW); Yun Chen Teng, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/050,234

(22) Filed: Jul. 31, 2018

(65) Prior Publication Data
US 2020/0044048 A1 Feb. 6, 2020

(51) Int. Cl.
| | |
|---|---|
| *H01L 21/324* | (2006.01) |
| *H01L 21/02* | (2006.01) |
| *H01L 21/06* | (2006.01) |
| *H01L 21/08* | (2006.01) |
| *H01L 29/66* | (2006.01) |
| *H01L 21/3213* | (2006.01) |
| *H01L 27/092* | (2006.01) |
| *H01L 21/3205* | (2006.01) |
| *H01L 21/8238* | (2006.01) |

(52) U.S. Cl.
CPC .... *H01L 29/66545* (2013.01); *H01L 21/0262* (2013.01); *H01L 21/02359* (2013.01); *H01L 21/02532* (2013.01); *H01L 21/02592* (2013.01); *H01L 21/02645* (2013.01); *H01L 21/02664* (2013.01); *H01L 21/32055* (2013.01); *H01L 21/32137* (2013.01); *H01L 21/823821* (2013.01); *H01L 21/823864* (2013.01); *H01L 27/0924* (2013.01); *H01L 29/66795* (2013.01)

(58) Field of Classification Search
None
See application file for complete search history.

(56) References Cited

U.S. PATENT DOCUMENTS

| | | | |
|---|---|---|---|
| 8,487,378 B2 | 7/2013 | Goto et al. | |
| 8,729,634 B2 | 5/2014 | Shen et al. | |
| 8,826,213 B1 | 9/2014 | Ho et al. | |
| 8,887,106 B2 | 11/2014 | Ho et al. | |
| 2006/0065893 A1* | 3/2006 | Jin | H01L 21/28114 257/65 |
| 2011/0081774 A1* | 4/2011 | Yeh | H01L 21/823835 438/591 |
| 2014/0282326 A1 | 9/2014 | Chen et al. | |

(Continued)

FOREIGN PATENT DOCUMENTS

TW 201621981 A 6/2016

*Primary Examiner* — Joseph C. Nicely
*Assistant Examiner* — Lamont B Koo
(74) *Attorney, Agent, or Firm* — Slater Matsil, LLP

(57) ABSTRACT

A method for forming a semiconductor device and a semiconductor device formed by the method are disclosed. In an embodiment, the method includes depositing a dummy dielectric layer on a fin extending from a substrate; depositing a dummy gate seed layer on the dummy dielectric layer; reflowing the dummy gate seed layer; etching the dummy gate seed layer; and selectively depositing a dummy gate material over the dummy gate seed layer, the dummy gate material and the dummy gate seed layer constituting a dummy gate.

20 Claims, 24 Drawing Sheets

(56) References Cited

U.S. PATENT DOCUMENTS

2016/0049483 A1\* 2/2016 Zhang .............. H01L 29/66545
  257/401
2016/0233092 A1\* 8/2016 Lin ................... H01L 21/28506
2017/0117274 A1\* 4/2017 Cai ................. H01L 21/823418

\* cited by examiner

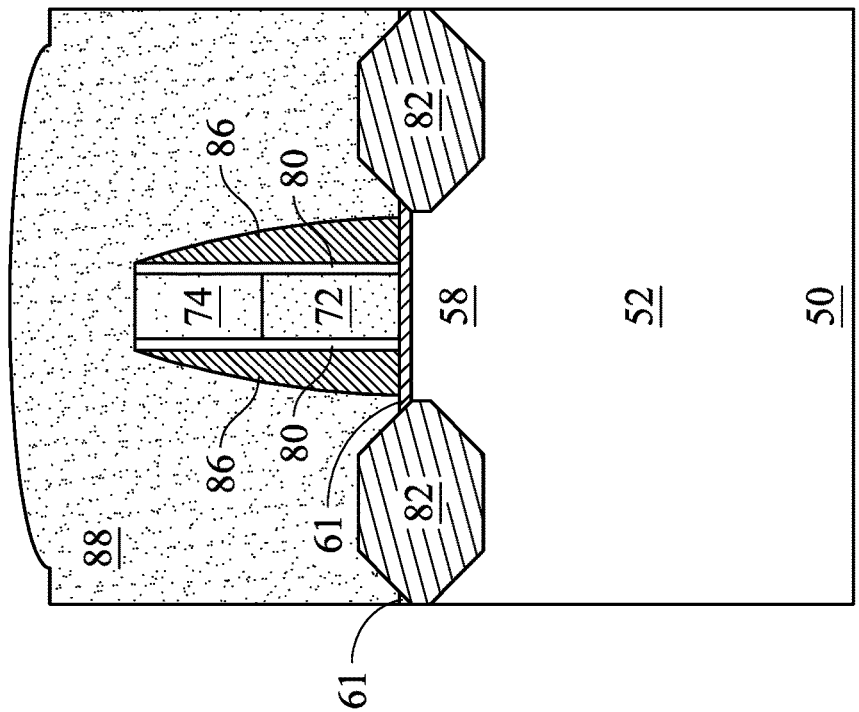
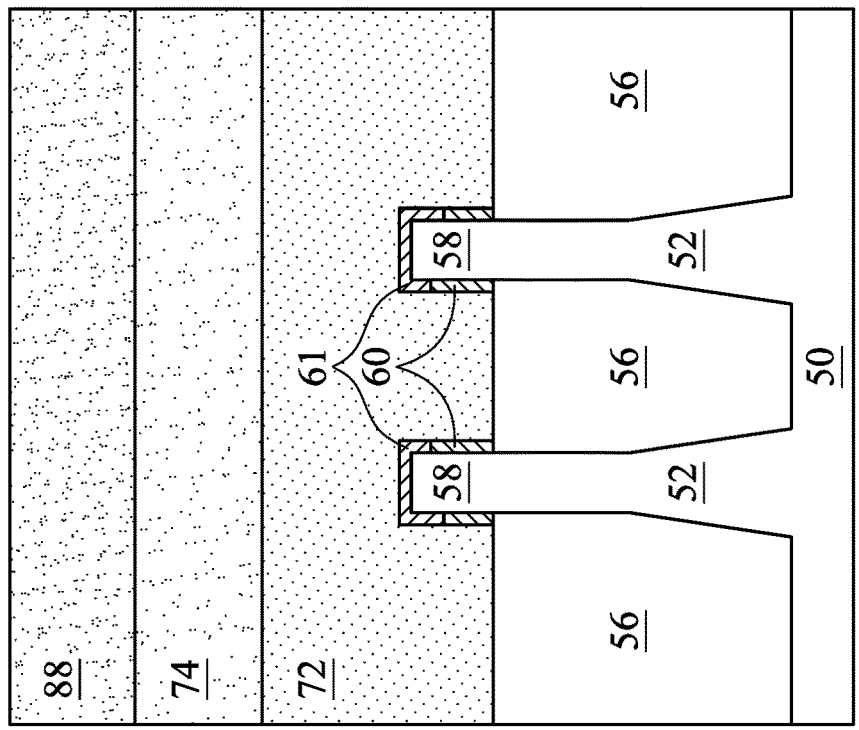
Figure 17A
Figure 17B

SEMICONDUCTOR DEVICE AND METHOD

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8, 9, 10, 11, 12, 13, 14A, 14B, 15A, 15B, 16A, 16B, 16C, 16D, 17A, 17B, 18A, 18B, 19A, 19B, 20A, 20B, 21A, 21B, 22A, 22B, and 23 are cross-sectional views of intermediate stages in the manufacturing of FinFETs, in accordance with some embodiments.

DETAILED DESCRIPTION

Figure 1:
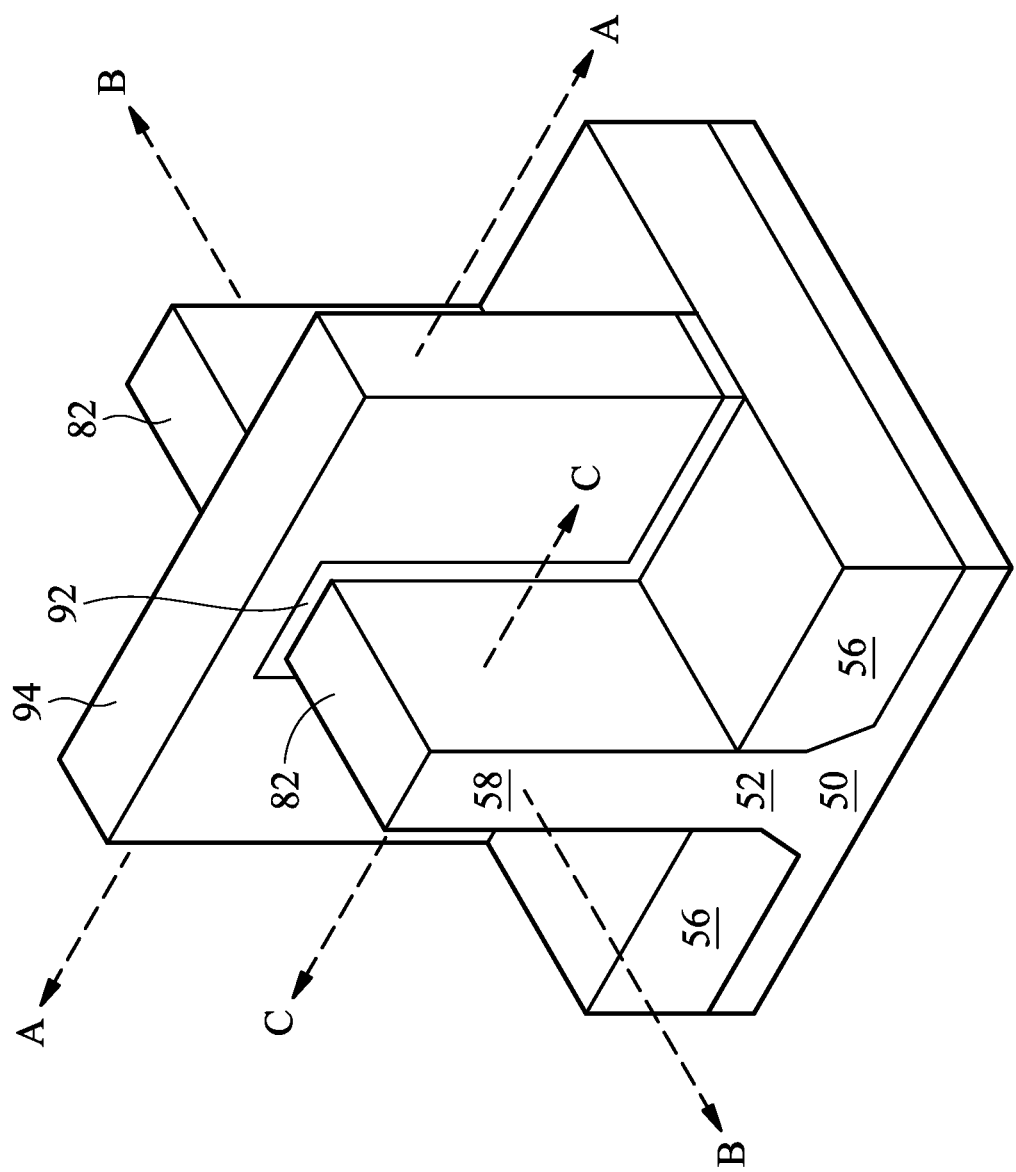
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide processes for forming improved dummy gates. For example, a dummy gate seed layer may be deposited over fins. The dummy gate seed layer may be reflowed from above the fins into trenches adjacent the fins. The dummy gate seed layer may be etched by a halogen-gas etch. The halogen-gas etch may also terminate exposed surface portions of a dummy dielectric layer disposed on the fins, between the fins and the dummy gate seed layer. An additional deposition process may be performed over the dummy gate seed layer and the dummy dielectric layer. The additional deposition process may selectively deposit material on the dummy gate seed layer. In some embodiments, the additional deposition process may deposit material on the dummy gate seed layer at a higher rate than on the dummy dielectric layer. The resulting structure may then be planarized to form the dummy gates.

Performing a bottom-up deposition of the dummy gates prevents the bending of the fins and further prevents the formation of seams or voids in the dummy gates. This improves device yield and reduces device failure.

FIG. 1 illustrates an example of a FinFET in a three-dimensional view for reference, in accordance with some embodiments. The FinFET comprises a fin 58 on a substrate 50 (e.g., a semiconductor substrate). Isolation regions 56 are disposed in the substrate 50, and the fin 58 protrudes above and from between neighboring isolation regions 56. Although the isolation regions 56 are described and illustrated as being separate from the substrate 50, as used herein the term "substrate" may be used to refer to just the semiconductor substrate or a semiconductor substrate inclusive of the isolation regions 56. A gate dielectric layer 92 is along sidewalls and over a top surface of the fin 58, and a gate electrode 94 is over the gate dielectric layer 92. Source/drain regions 82 are disposed in opposite sides of the fin 58 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to the cross-section A-A and is along a longitudinal axis of the fin 58 and in a direction of, for example, a current flow between the source/drain regions 82 of the FinFET. Cross-section C-C is parallel to the cross-section A-A and extends through one of the source/drain regions 82 of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 23 are cross-sectional views of intermediate stages in the manufacturing of FinFETs, in accordance with some embodiments. FIGS. 2 through 13 illustrate reference cross-section A-A illustrated in FIG. 1, except for multiple fins/FinFETs. In FIGS. 14A through 22B, figures ending with an "A" designation are illustrated along reference cross-section A-A illustrated in FIG. 1 and figures ending with a "B" designation are illustrated along a similar cross-section B-B illustrated in FIG. 1, except for multiple fins/FinFETs. FIGS. 16C and 16D are illustrated along reference cross-section C-C illustrated in FIG. 1, except for multiple fins/FinFETs. FIG. 23 illustrates reference cross-section B-B illustrated in FIG. 1, except for multiple gates/FinFETs.

Figure 2:
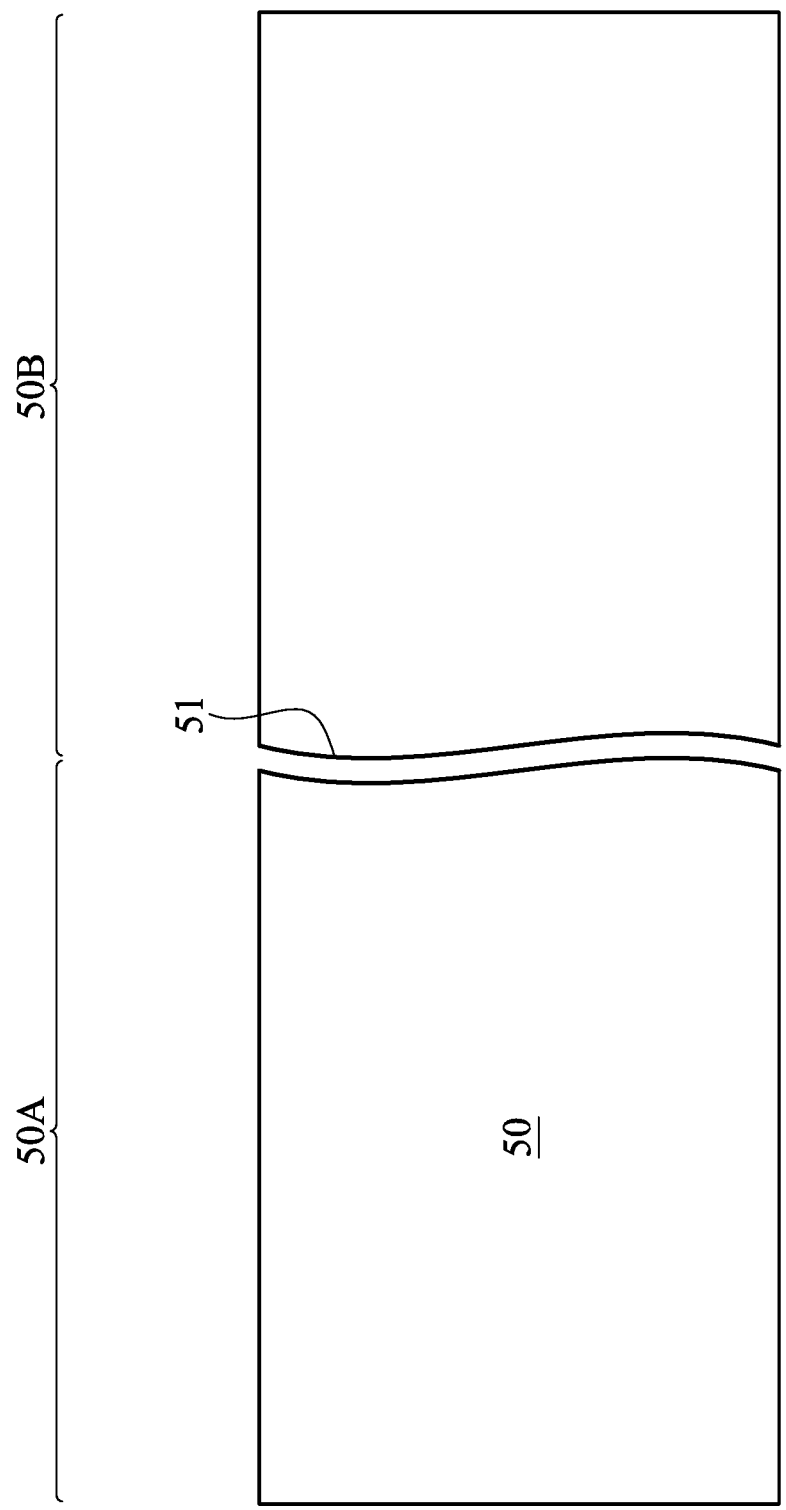

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type dopant or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate which is typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a first region 50A and a second region 50B. The first region 50A may be for forming n-type devices, such as NMOS transistors, e.g., n-type FinFETs. The second region 50B may be for forming p-type devices, such as PMOS transistors, e.g., p-type FinFETs. The first region 50A may be physically separated from the second region 50B (as illustrated by divider 51), and any number of device features (e.g., other active devices, doped regions, isolation structures, etc.) may be disposed between the first region 50A and the second region 50B. In some embodiments, both the first region 50A and the second region 50B are used to form the same type of devices, such as both regions being for n-type devices or p-type devices.

Figure 3:
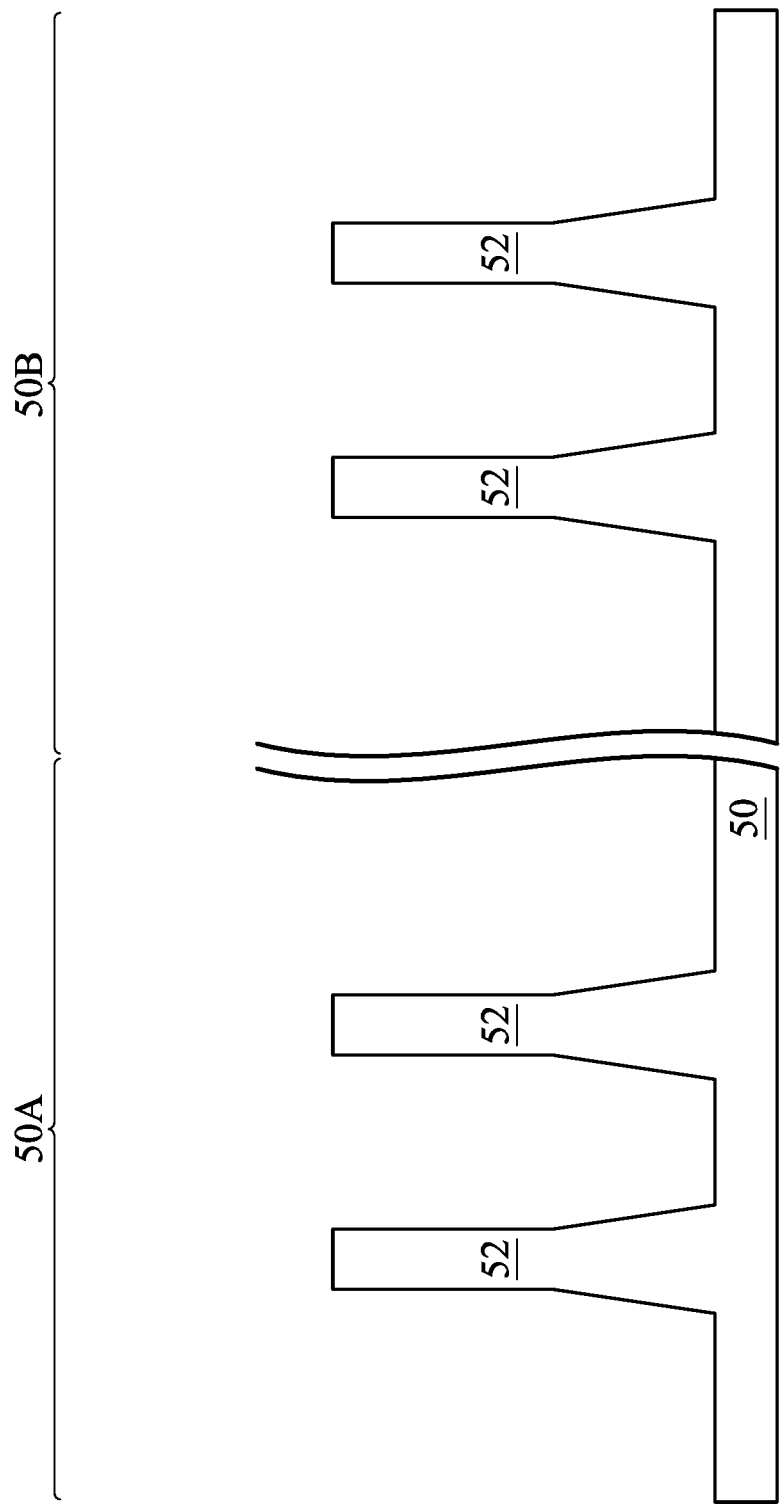

In FIG. 3, fins 52 are formed in the substrate 50. The fins 52 are semiconductor strips. In some embodiments, the fins 52 may be formed in the substrate 50 by etching trenches in the substrate 50. The etching may be one or more of any acceptable etch process, such as a reactive ion etch (RIE), neutral beam etch (NBE), the like, or a combination thereof. The etching may be anisotropic. Please note, although the fins 52 are illustrated as having linear edges, the fins 52 may be rounded or have any other suitable shape. The fins 52 may have a fin-to-fin spacing of between about 5 nm and about 50 nm, such as about 20 nm. However, in some embodiments, the fins 52 may have a fin-to-fin spacing of greater than about 50 nm or less than about 5 nm.

Figure 4:
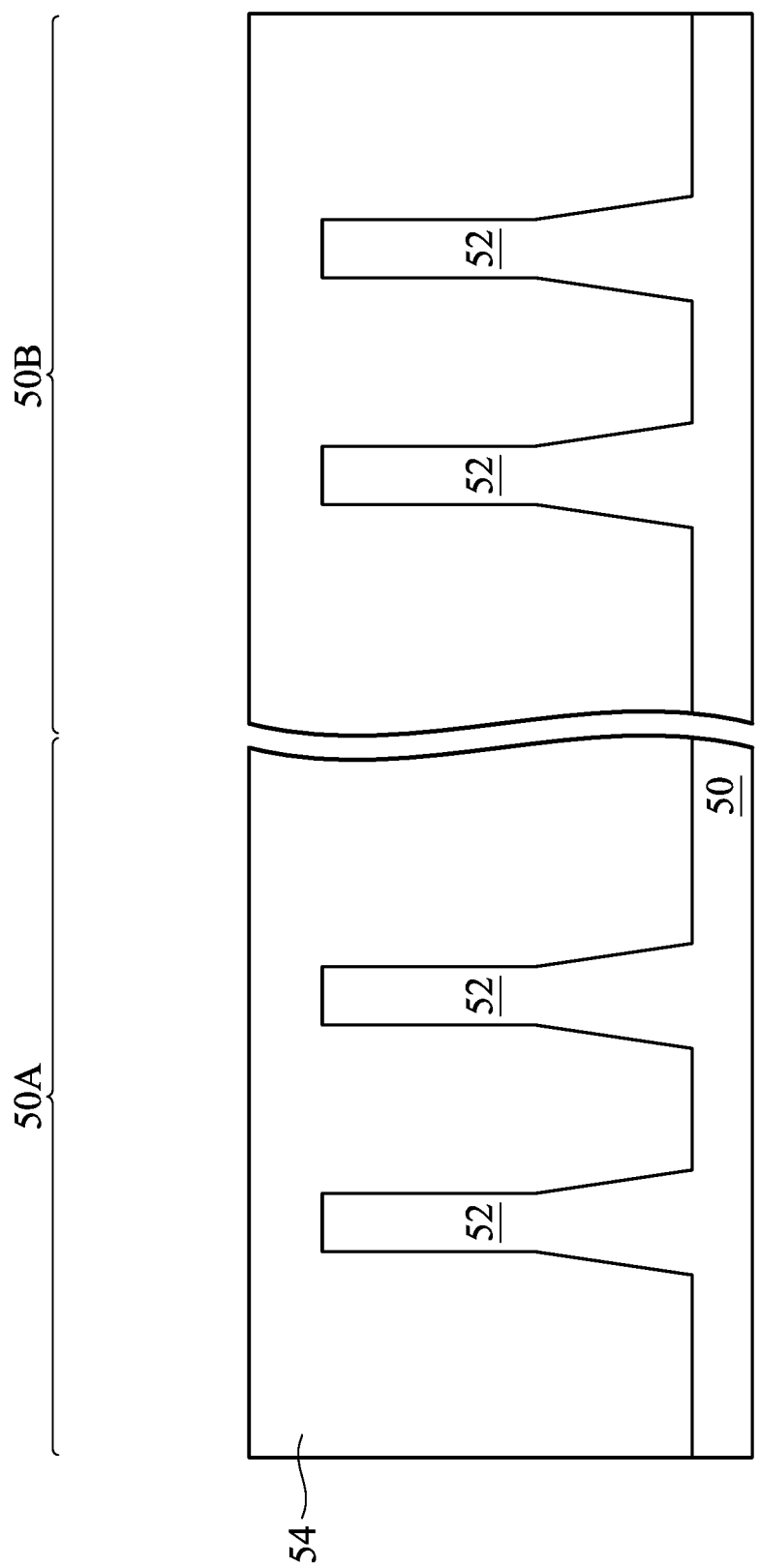

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system, followed by a post-deposition cure to convert the material to another material, such as an oxide), the like, or a combination thereof. Other insulation materials formed by any acceptable process may be used. In the illustrated embodiment, the insulation material 54 is silicon oxide formed by an FCVD process. An anneal process may be performed once the insulation material is formed. In an embodiment, the insulation material 54 is formed such that excess insulation material covers the fins 52.

Figure 5:
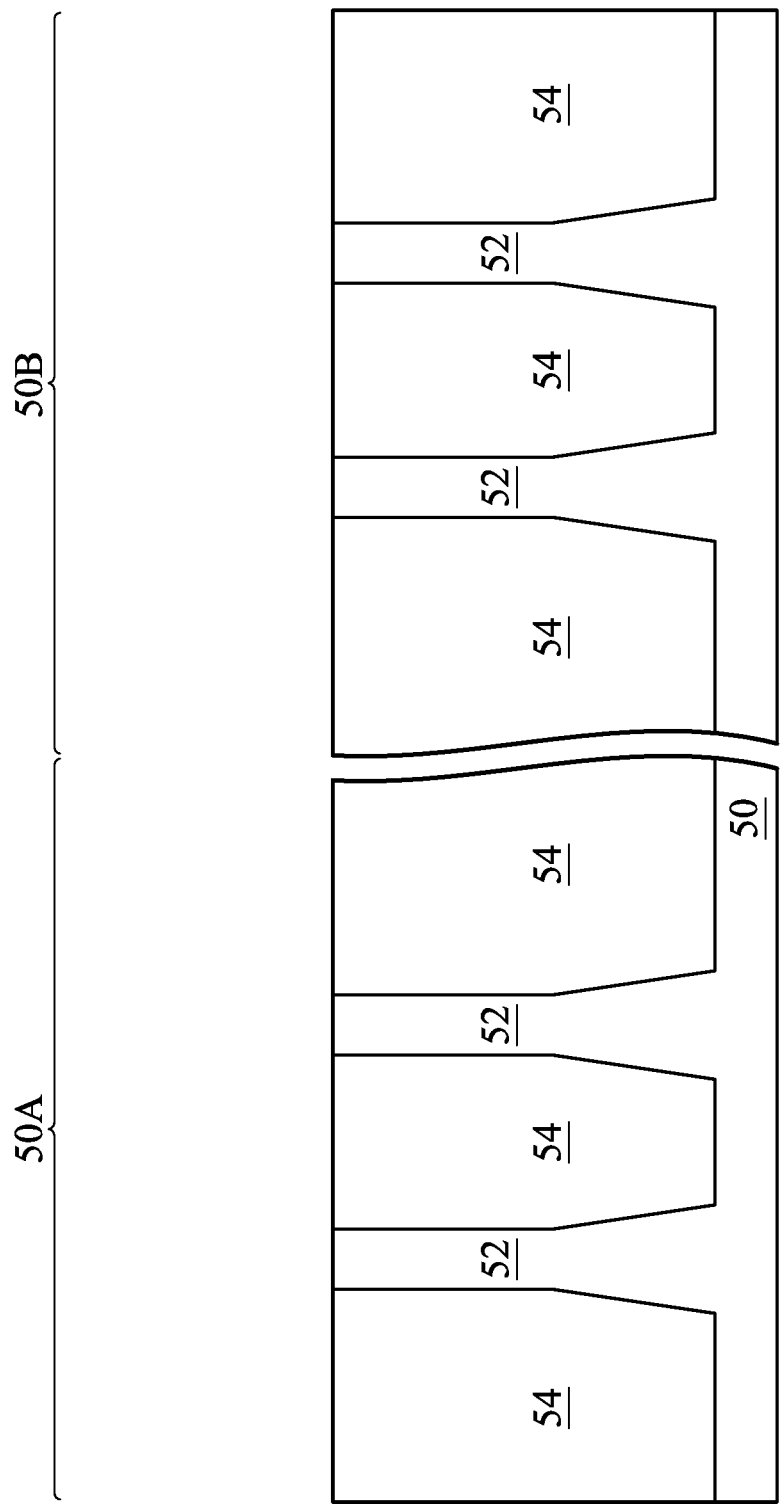

In FIG. 5, a planarization process is applied to the insulation material 54. In some embodiments, the planarization process includes a chemical mechanical polish (CMP), an etch-back process, combinations thereof, or the like. The planarization process exposes the fins 52. Top surfaces of the fins 52 and the insulation material 54 are level after the planarization process is complete.

Figure 6:
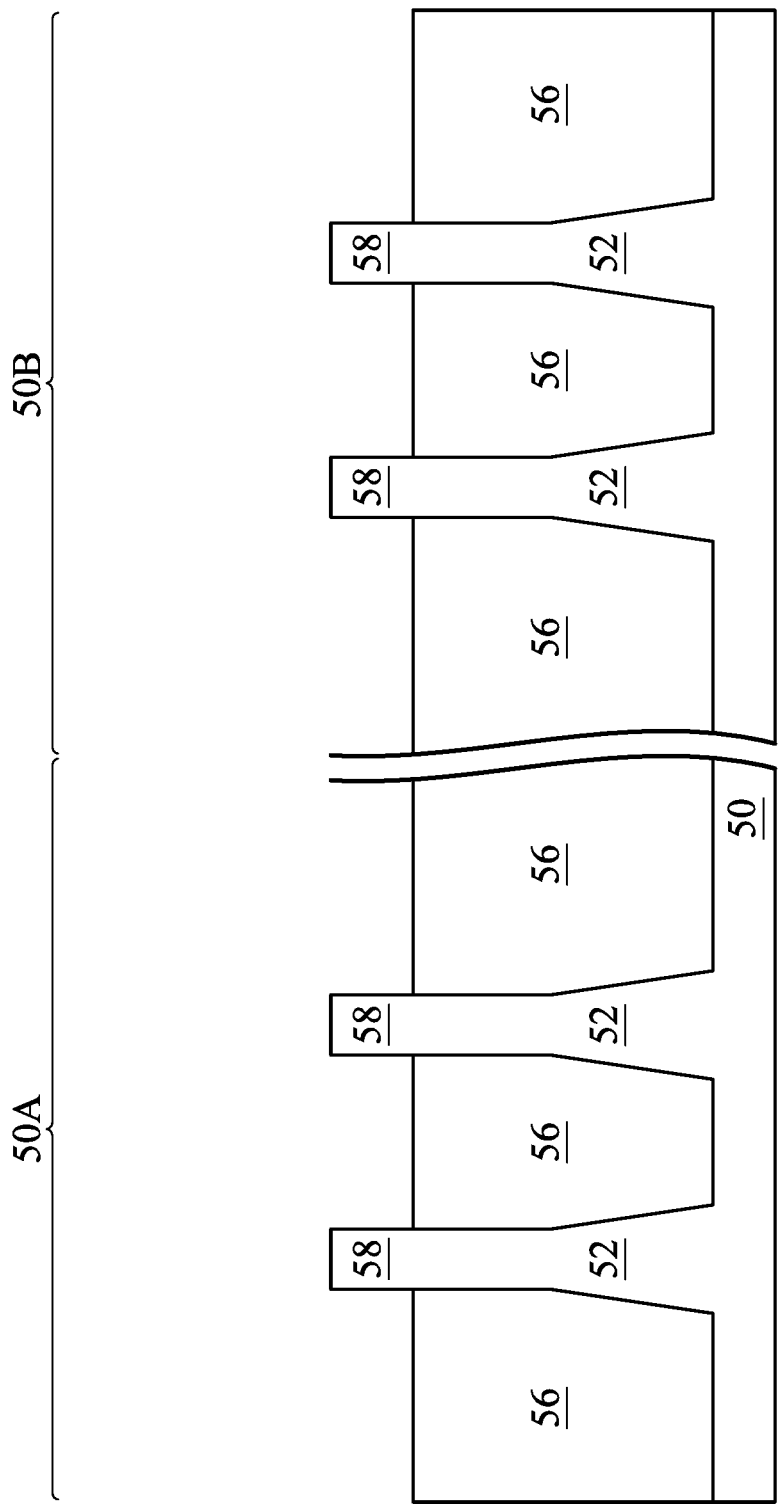

In FIG. 6, the insulation material 54 is recessed to form shallow trench isolation (STI) regions 56. The insulation material 54 is recessed such that fins 58 in the first region 50A and in the second region 50B protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by using an appropriate etch. The STI regions 56 may be recessed using an acceptable etching process, such as one that is selective to the material of the insulation material 54. For example, a chemical oxide removal using a plasma-less gaseous etching process (e.g., an etching process using hydrogen fluoride (HF) gas, ammonia ($NH_3$) gas, or the like), a remote plasma assisted dry etch process (e.g., a process using hydrogen ($H_2$), nitrogen trifluoride ($NF_3$), and ammonia by-products, or the like), or dilute hydrofluoric (dHF) acid may be used.

A person having ordinary skill in the art will readily understand that the process described with respect to FIGS. 2 through 6 is just one example of how the fins 58 may be formed. In some embodiments, a dielectric layer may be formed over a top surface of the substrate 50; trenches may be etched through the dielectric layer; homoepitaxial structures may be epitaxially grown in the trenches; and the dielectric layer may be recessed such that the homoepitaxial structures protrude from the dielectric layer to form the fins 58. In some embodiments, heteroepitaxial structures may be used for the fins 52. For example, the fins 52 in FIG. 5 may be recessed, and a material different from the fins 52 may be epitaxially grown in their place. In an even further embodiment, a dielectric layer may be formed over a top surface of the substrate 50; trenches may be etched through the dielectric layer; heteroepitaxial structures may be epitaxially grown in the trenches using a material different from the substrate 50; and the dielectric layer may be recessed such that the heteroepitaxial structures protrude from the dielectric layer to form the fins 58. In some embodiments where homoepitaxial or heteroepitaxial structures are epitaxially grown, the epitaxially grown materials may be in situ doped during growth. This may obviate prior and subsequent implantations, although in situ and implantation doping may be used together. Still further, it may be advantageous to epitaxially grow a material in an NMOS region different from the material in a PMOS region. In various embodiments, the fins 58 may be formed from silicon germanium ($Si_xGe_{1-x}$, where x may be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

In additional embodiments, appropriate wells (not separately illustrated) may be formed in the fins 58, the fins 52, and/or the substrate 50. In some embodiments, a P well may be formed in the first region 50A and an N well may be formed in the second region 50B. In some embodiments, a P well or an N well may be formed in both the first region 50A and the second region 50B.

In embodiments in which different well types are formed, the different implant steps for the first region 50A and the second region 50B may be achieved using a photoresist or other masks (not separately illustrated). For example, a photoresist may be formed over the fins 58 and the STI regions 56 in the first region 50A and the second region 50B. The photoresist is patterned to expose the second region 50B of the substrate 50, such as a PMOS region. The photoresist may be formed by using a spin-on technique and may be patterned using acceptable photolithography techniques. Once the photoresist is patterned, an n-type impurity implant is performed in the second region 50B, and the photoresist may act as a mask to substantially prevent n-type impurities from being implanted into the first region 50A, such as an NMOS region. The n-type impurities may be phosphorus, arsenic, or the like implanted in the region to a concentration of equal to or less than $10^{18}$ cm$^{-3}$, such as between about $10^{17}$ cm$^{-3}$ and about $10^{18}$ cm$^{-3}$. After the implant, the photoresist is removed, such as by an acceptable ashing process.

Following the implanting of the second region 50B, a second photoresist is formed over the fins 58 and the STI regions 56 in the first region 50A and the second region 50B. The photoresist is patterned to expose the first region 50A of the substrate 50, such as the NMOS region. The photoresist may be formed by using a spin-on technique and may be patterned using acceptable photolithography techniques. Once the photoresist is patterned, a p-type impurity implant may be performed in the first region 50A, and the photoresist may act as a mask to substantially prevent p-type impurities from being implanted into the second region 50B, such as the PMOS region. The p-type impurities may be boron, $BF_2$, or the like implanted in the region to a concentration of equal to or less than $10^{18}$ cm$^{-3}$, such as between about $10^{17}$ cm$^{-3}$ and about $10^{18}$ cm$^{-3}$. After the implant, the photoresist may be removed, such as by an acceptable ashing process.

After the implants of the first region 50A and the second region 50B, an anneal may be performed to activate the p-type and/or n-type impurities that were implanted. In some embodiments, the grown materials of epitaxial fins may be in situ doped during growth, which may obviate the implantations. According to some embodiments, in situ and implantation doping may be used together.

Figure 7:
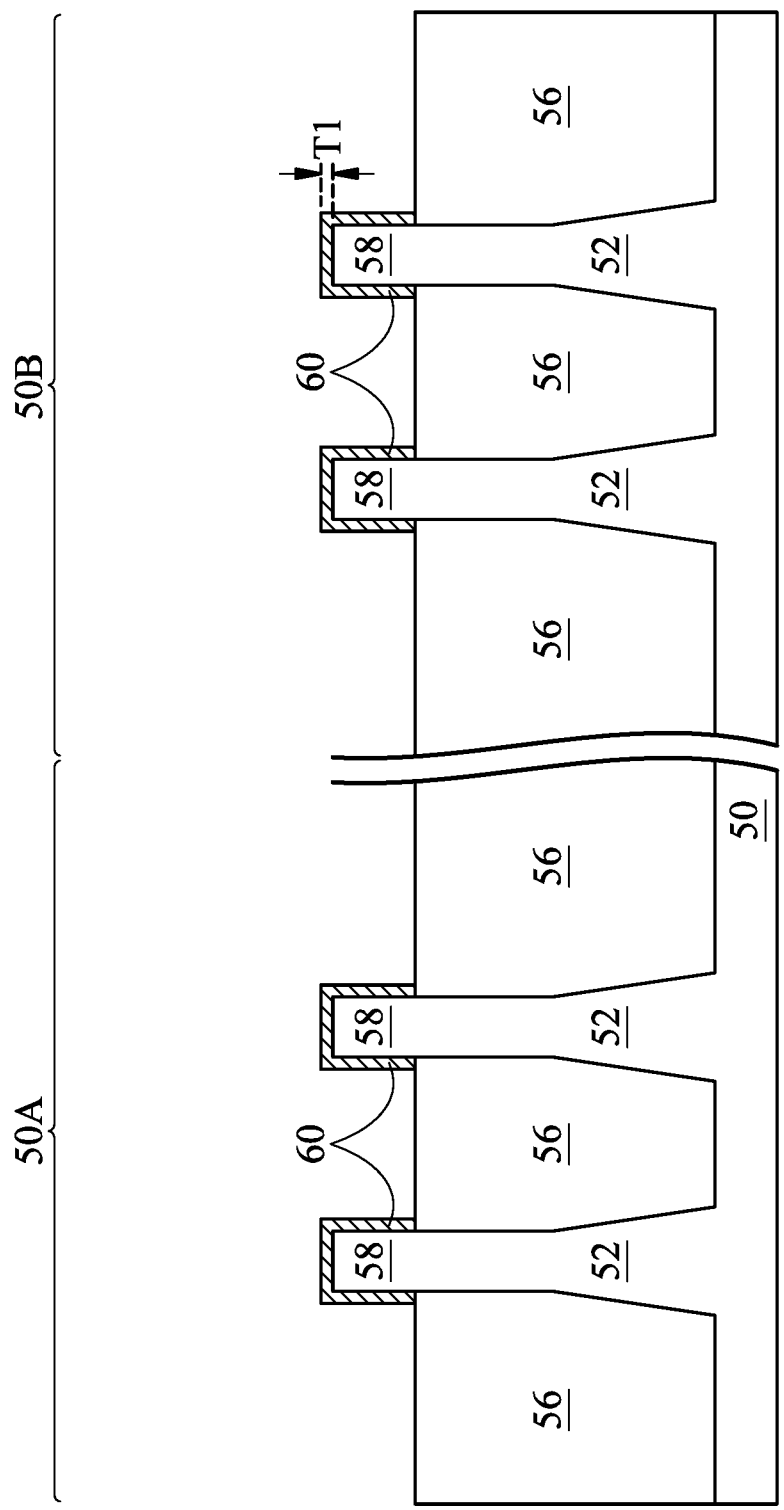

In FIG. 7, a dummy dielectric layer 60 is formed on the fins 58. The dummy dielectric layer 60 may be, for example, silicon oxide, silicon nitride, a combination thereof, or the like, and may be deposited or thermally grown according to acceptable techniques. The dummy dielectric layer 60 may have a thickness T1 of between about 10 Å and about 100 Å, such as about 40 Å. As illustrated in FIG. 7, the dummy dielectric layer 60 may be selectively formed on the fins 58 and may not be formed on the STI regions 56.

Figure 8:
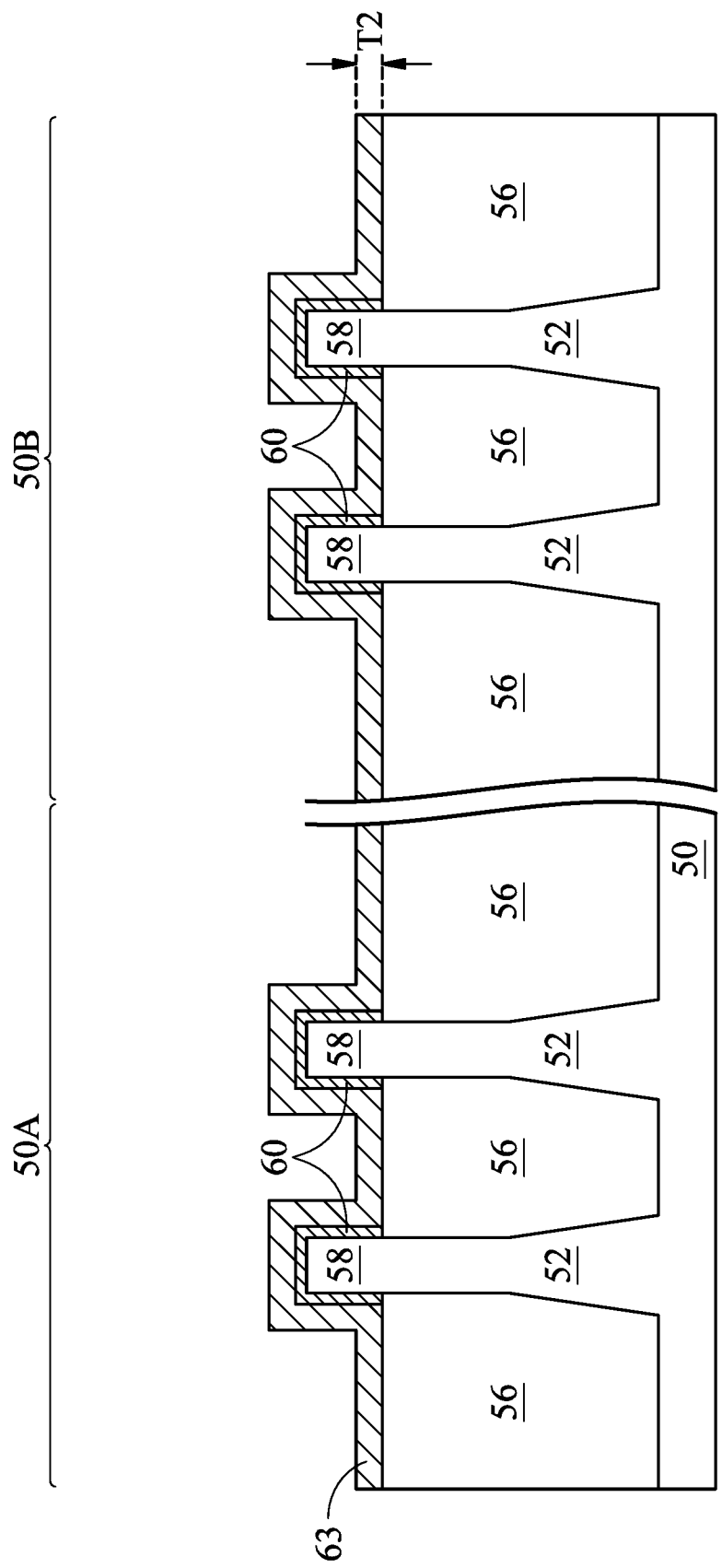

In FIG. 8, a dummy gate material 63 is formed over the dummy dielectric layer 60 and the STI regions 56. In some embodiments, the dummy gate material 63 may be formed of an amorphous silicon (a-Si) material. The dummy gate material 63 may be formed by any suitable process, such as a chemical vapor deposition (CVD) process, an atomic layer deposition (ALD) process, a low pressure chemical vapor deposition (LPCVD) process, or the like. The formation of the dummy gate material 63 may include depositing a silicon seed layer (not separately illustrated), and then growing additional silicon on the silicon seed layer. In accordance with some embodiments, the dummy gate material 63 is referred to as a dummy gate seed layer. Precursors used to deposit the dummy gate material 63 may include $SiH_3$—N $((CH—(CH_3)_2)_2$, disilane $(Si_2H_6)$, monosilane $(SiH_4)$, combinations thereof, or the like. The dummy gate material 63 may be free from other elements such as germanium (Ge), n-type impurities (such as phosphorous (P) and arsenic (As)), and p-type impurities (such as boron (B) and indium (In)), or may include some of these elements.

In embodiments in which disilane is used to grow the dummy gate material 63, the temperature may be in the range between about 300° C. and about 450° C. In embodiments in which monosilane is used to grow the dummy gate material 63, the temperature may be in the range between about 400° C. and about 600° C. Depending on the temperature, the growth rate of the dummy gate material 63, and other process conditions, the dummy gate material 63 may be an amorphous silicon layer or a polysilicon layer. As illustrated in FIG. 8, the dummy gate material 63 may be a conformal layer and may have a relatively uniform thickness along top surfaces of the dummy dielectric layer 60 and the STI regions 56 and alongside surfaces of the dummy dielectric layer 60. The dummy gate material 63 may have a thickness T2 of between about 1 nm and about 20 nm, such as about 5 nm.

Figure 9:
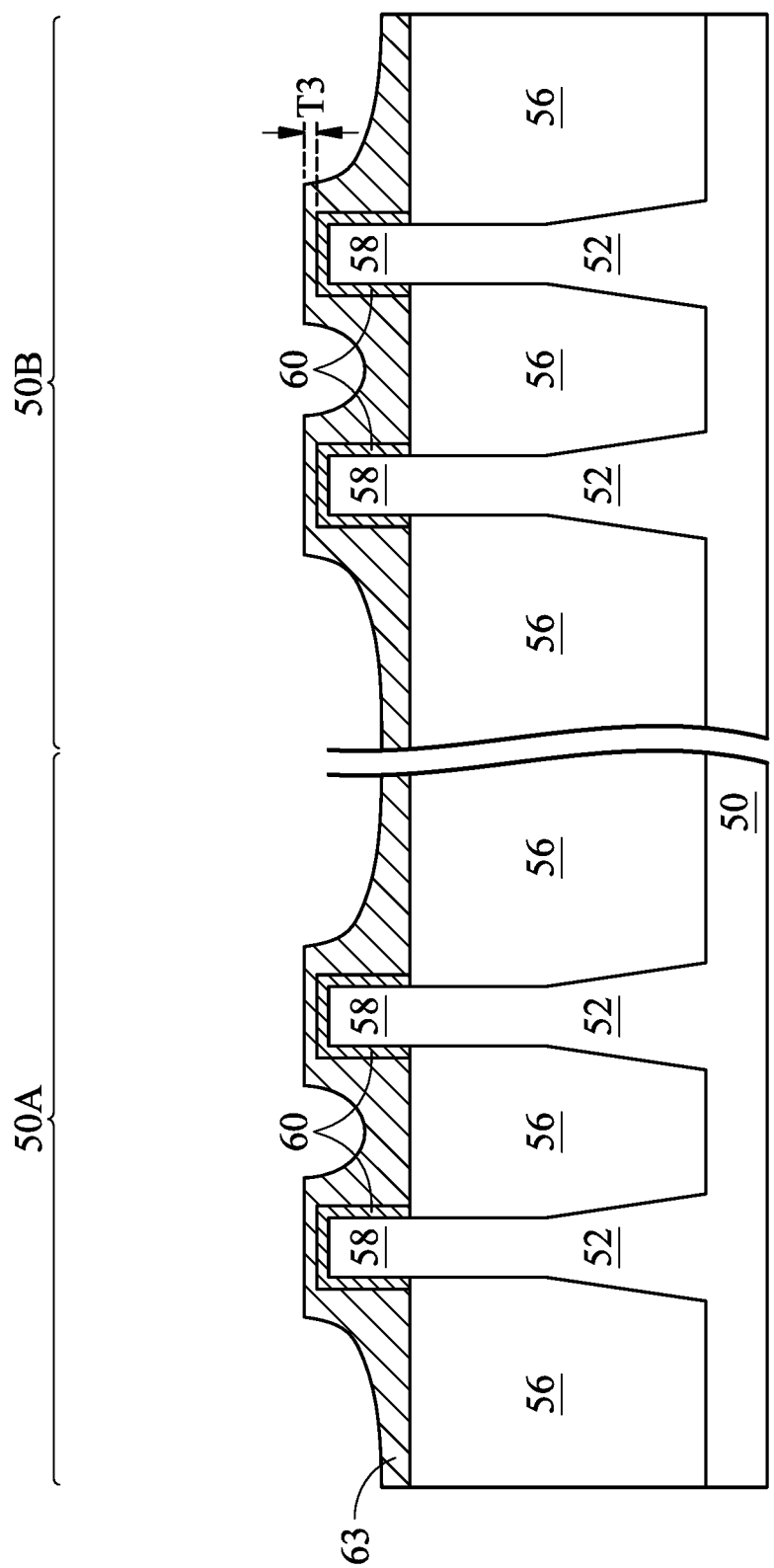

In FIG. 9, the dummy gate material 63 is reflowed from above the fins 58 into trenches alongside the fins 58. The dummy gate material 63 may be reflowed by heating the substrate 50, by circulating heated gas over the top surface of the dummy gate material 63, by combinations thereof, or by any other suitable method. In some embodiments, the reflow is performed at a temperature in the range of between about 450° C. and about 600° C., such as about 470° C. The reflow may last between about 3 minutes and about 2 hours, depending on the temperature, with a higher temperature corresponding to a shorter reflow time and a lower temperature corresponding to a longer reflow time. During the reflow, process gases such as nitrogen $(N_2)$ or hydrogen $(H_2)$ may be introduced. The dummy gate material 63 may be reflowed at a pressure of less than about 100 Torr, such as between about 1 mTorr and about 90 Torr. The dummy gate material 63 may be reflowed such that a thickness T3 of the dummy gate material 63 on the top surface of the dummy dielectric layer 60 is between about 0.1 nm and about 20 nm, such as about 5 nm. Following the reflow, a concentration of hydrogen (H) in the dummy gate material 63 may be between about 0.1 percent by weight and about 2 percent by weight, or less than about 2 percent by weight. In some embodiments, the dummy gate material 63 may have a hydrogen concentration of less than about $2\times10^{20}$ atoms/cm$^3$ after reflowing the dummy gate material 63.

Figure 10:
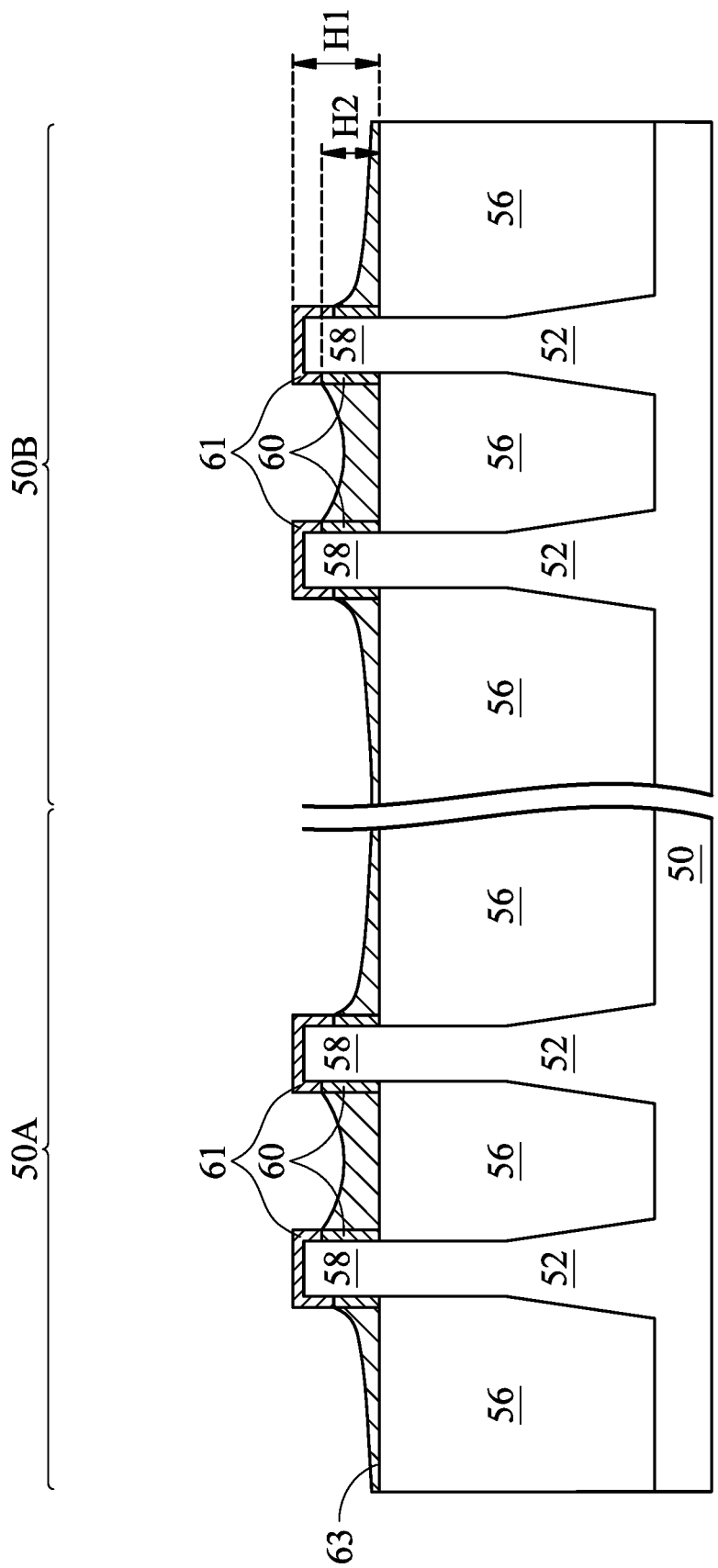

In FIG. 10, the dummy gate material 63 is etched in order to expose at least a portion of the dummy dielectric layer 60. The dummy gate material 63 may be etched by any suitable process, such as a halogen-based gas etch (e.g., a halogen-based plasma etch) or the like. The etching process may use a suitable gas. The etching process may use a halogen-containing gas, such as a gas containing chlorine $(Cl_2)$, fluorine $(F_2)$, bromine $(Br_2)$, iodine $(I_2)$, combinations thereof, or the like. The etching gas may react with the exposed portions of the dummy dielectric layer 60 to terminate the exposed portions of the dummy dielectric layer 60, forming a halogen-terminated dummy dielectric layer 61. The halogen-terminated dummy dielectric layer 61 may act as a passivation layer. In some embodiments, the etching gas may also react with exposed portions of the dummy gate material 63 to terminate exposed portions of the dummy gate material 63, forming a halogen-terminated layer on the exposed portion of the dummy gate material 63 (not separately illustrated).

The dummy gate material 63 may be etched such that a height H2 of the dummy gate material 63 is greater than about ten percent of a height H1 of the dummy dielectric layer 60 in combination with the halogen-terminated dummy dielectric layer 61. For example, the height H1 may be between about 30 nm and about 100 nm, such as about 35 nm. The height H2 may be between about 3 nm and about 99 nm, such as about 30 nm. The height H2 may be between about 10 percent and about 99 percent of the height H1, such as about 80 percent of the height H1. In some embodiments, the height H2 may be greater than about 10 percent of the height H1.

Figure 11:
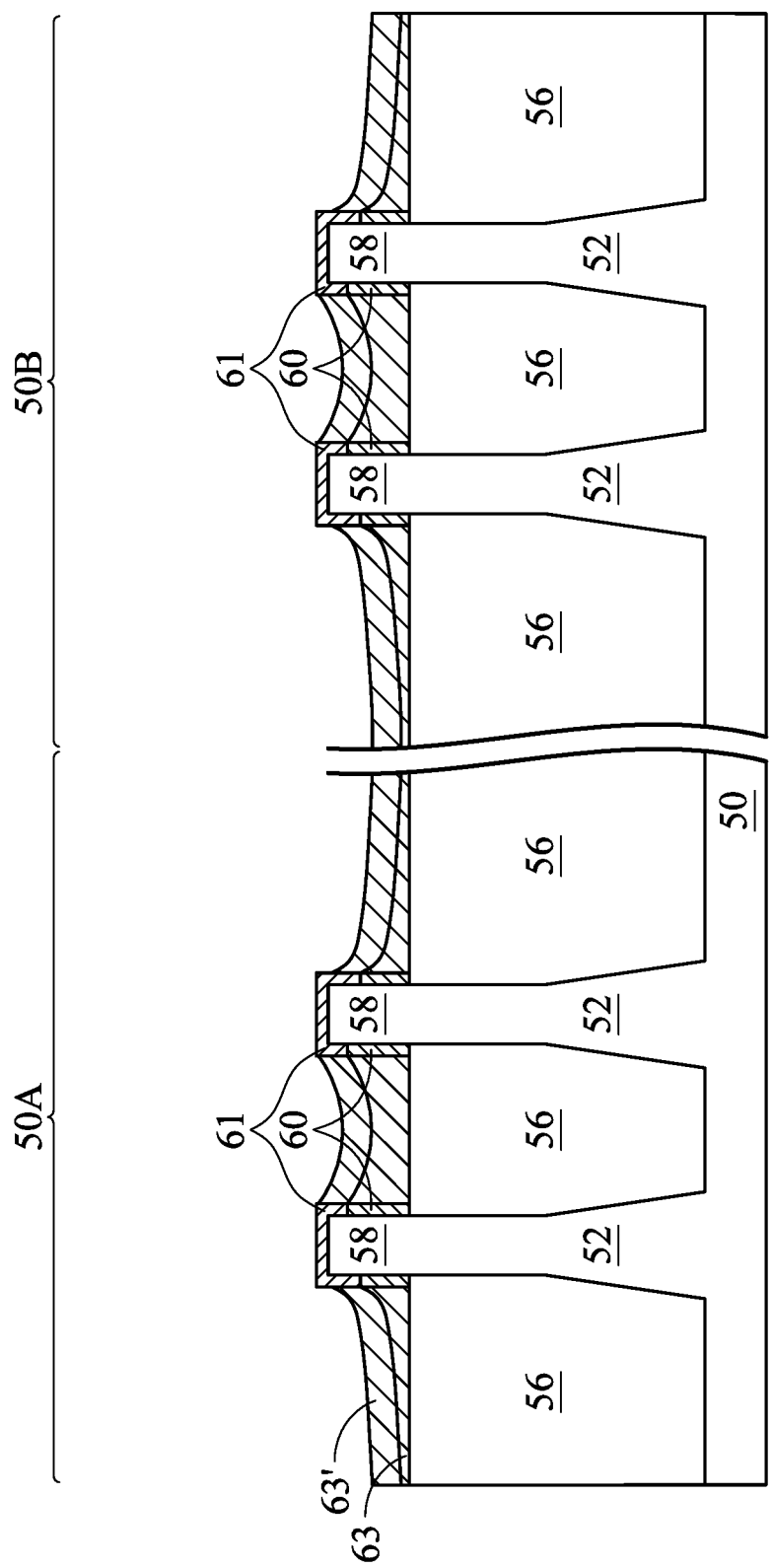

In FIG. 11, an additional dummy gate material 63' is deposited on the dummy gate material 63 by an additional deposition process, such as CVD, ALD, or the like. The additional deposition process may be selective and deposition may only occur on the dummy gate material 63, not on the halogen-terminated dummy dielectric layer 61. As such, the additional dummy gate material 63' may be deposited over the dummy gate material 63 of FIG. 10 in a bottom-up process. In some embodiments, the additional dummy gate material 63' may be deposited over both the dummy gate material 63 and the halogen-terminated dummy dielectric layer, but may occur at a higher rate on the dummy gate material 63 than the halogen-terminated dummy dielectric layer 61. In some embodiments, the halogen-terminated dummy dielectric layer 61 may have an incubation time (e.g., a time required for the additional dummy gate material 63' to form on a surface of the layer after exposure to the additional deposition process) that is greater than an incubation time for the dummy gate material 63 by more than about 40 minutes or more than about 5 minutes.

Figure 12:
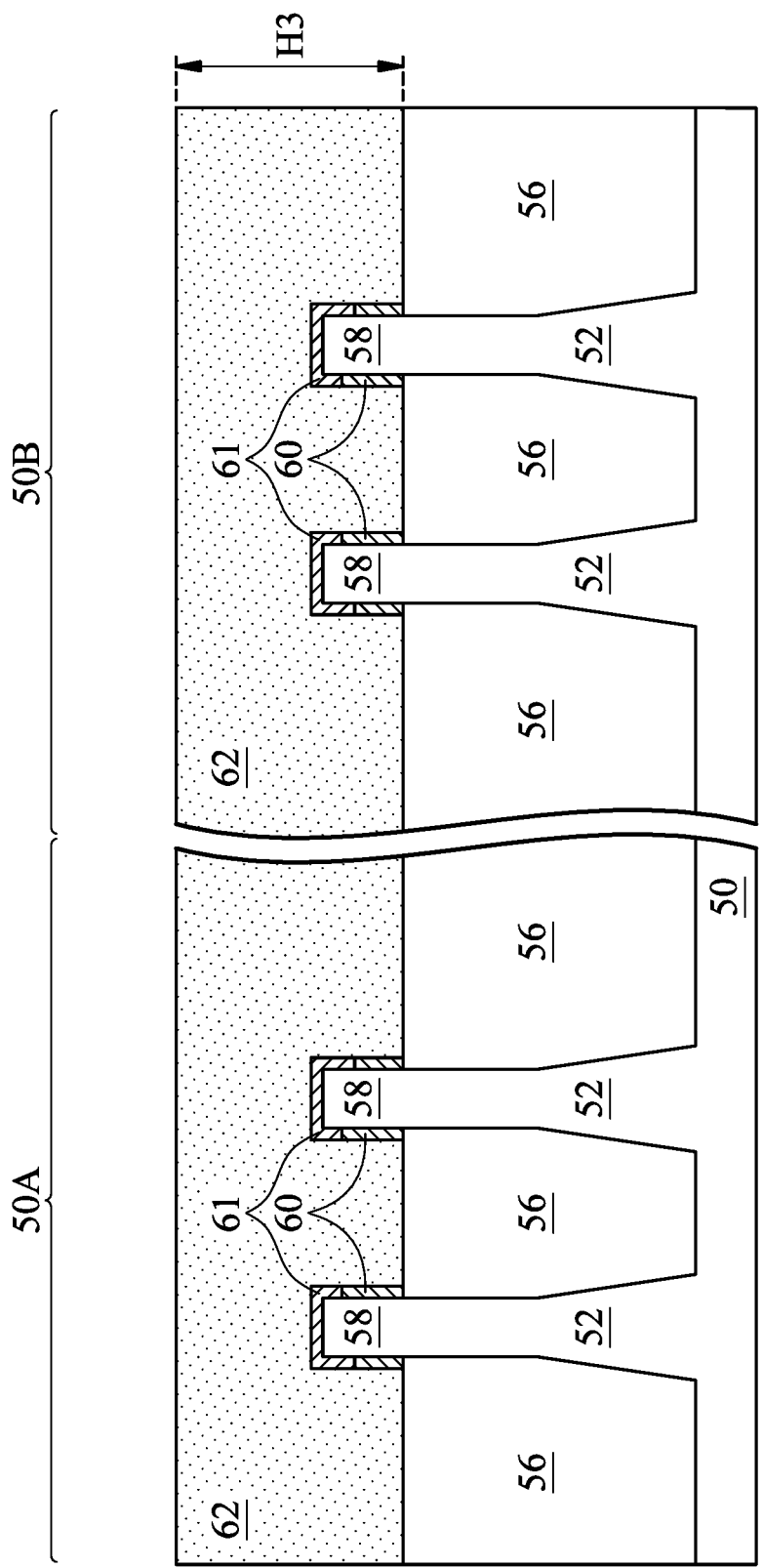

In FIG. 12, the additional dummy gate material 63' is further deposited by the additional deposition process and then planarized to form a dummy gate layer 62. The dummy gate layer 62 may be planarized by any suitable planarization process, such as by a chemical mechanical planarization (CMP) process, grinding, an etch-back planarization process, or the like. The dummy gate layer 62 may have a height H3 of between about 60 nm and about 190 nm, such as about 100 nm. The dummy gate layer 62 may be formed of the same or similar materials as the dummy gate material 63. For example, the dummy gate layer 62 may be formed of an amorphous silicon (a-Si) material throughout.

Forming the dummy gate layer 62 by depositing the dummy gate material 63, reflowing the dummy gate material 63, etching the dummy gate material 63 and terminating the dummy dielectric layer 60, and performing additional deposition of the additional dummy gate material 63' on the dummy gate material 63 (e.g., forming the dummy gate layer 62 by a bottom-up deposition process) reduces the formation of seams or voids between the fins 58 and reduces the aspect ratio of trenches between the fins 58. This process also reduces bending of the fins 58. For example, a delta fin-to-fin spacing (e.g., a variation or a change in fin-to-fin spacing) after forming the dummy gate layer may be less than about 6 nm, such as about 0.55 nm, or about 0.29 nm. Both seams/voids formed in the dummy gate layer 62 and bending of the fins 58 may cause problems with the deposition of a replacement gate (discussed below in reference to FIGS. 20A and 20B), and forming the dummy gate layer 62 by the above-described methods advantageously reduces these problems.

In some embodiments, the above-described bottom-up deposition process may be used in forming transistors in some regions on the substrate 50, and conventional processes may be used in forming transistors in other regions on the substrate 50. Only the transistors formed by the above-described bottom-up deposition process may experience the benefits of the bottom-up process. Moreover, the halogen-terminated dummy dielectric layer 61 may only be present in transistors formed by the bottom-up process. In contrast, transistors formed by conventional process may include a dummy dielectric layer which is not halogen-terminated.

Figure 13:
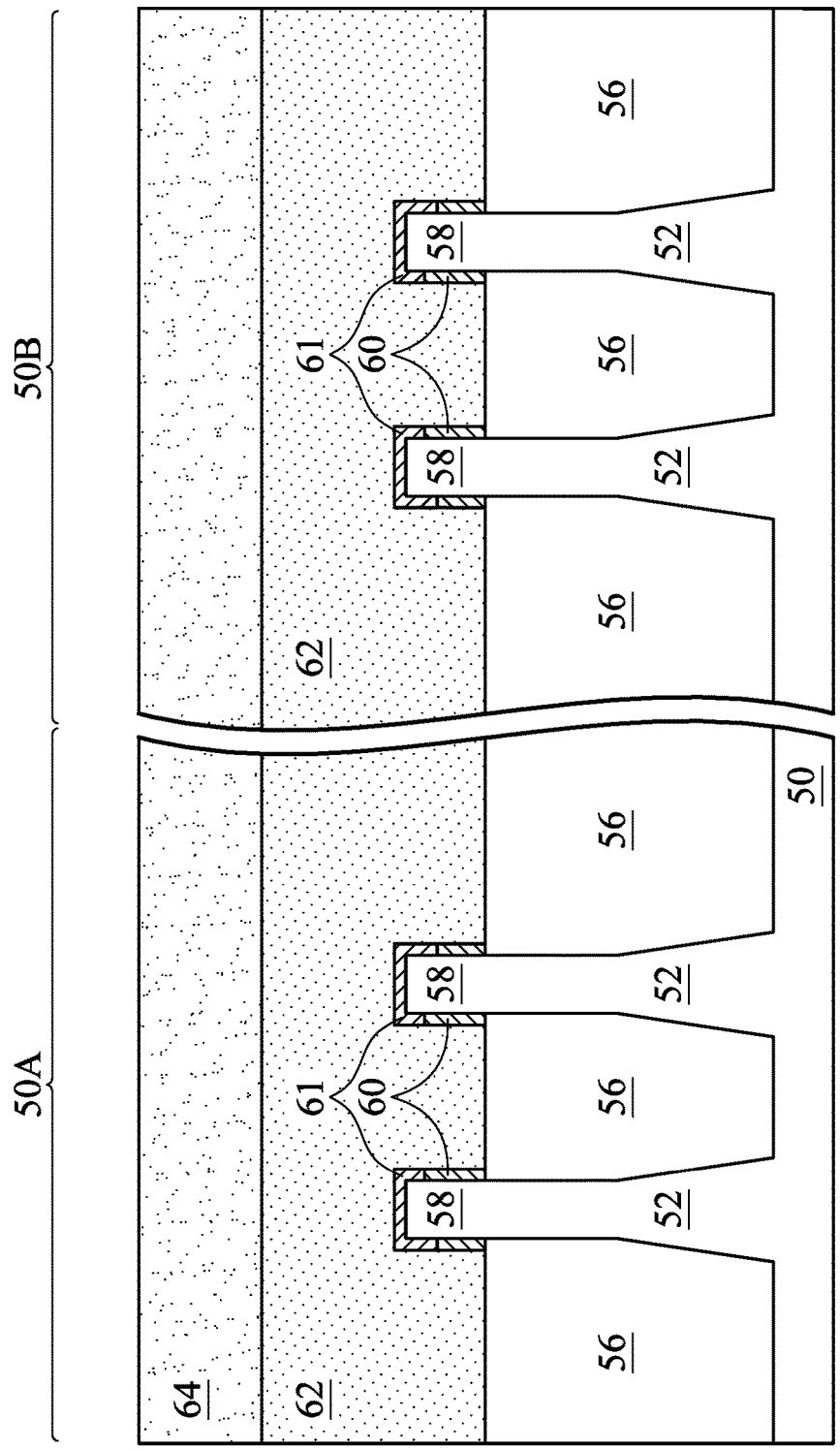

In FIG. 13, a mask layer 64 is formed over the dummy gate layer 62. The mask layer 64 may be deposited over the dummy gate layer 62 by any suitable method, such as CVD, plasma-enhanced CVD (PECVD), low pressure CVD (LPCVD), or the like. The mask layer 64 may include, for example, silicon nitride (e.g., $Si_3N_4$), silicon oxide ($SiO_2$), silicon oxynitride ($Si_2N_2O$), or the like.

FIGS. 14A through 22B illustrate various additional steps in the manufacturing of embodiment devices. FIGS. 14A through 22B illustrate features in either of the first region 50A and the second region 50B. For example, the structures illustrated in FIGS. 14A through 22B may be applicable to both the first region 50A and the second region 50B. Differences (if any) in the structures of the first region 50A and the second region 50B are described in the text accompanying each figure.

Figure 14B:
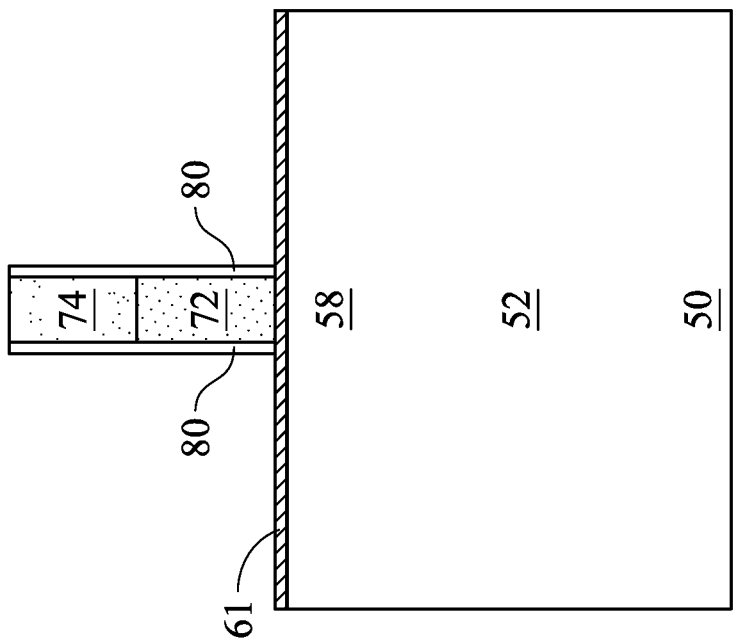
Figure 14A:
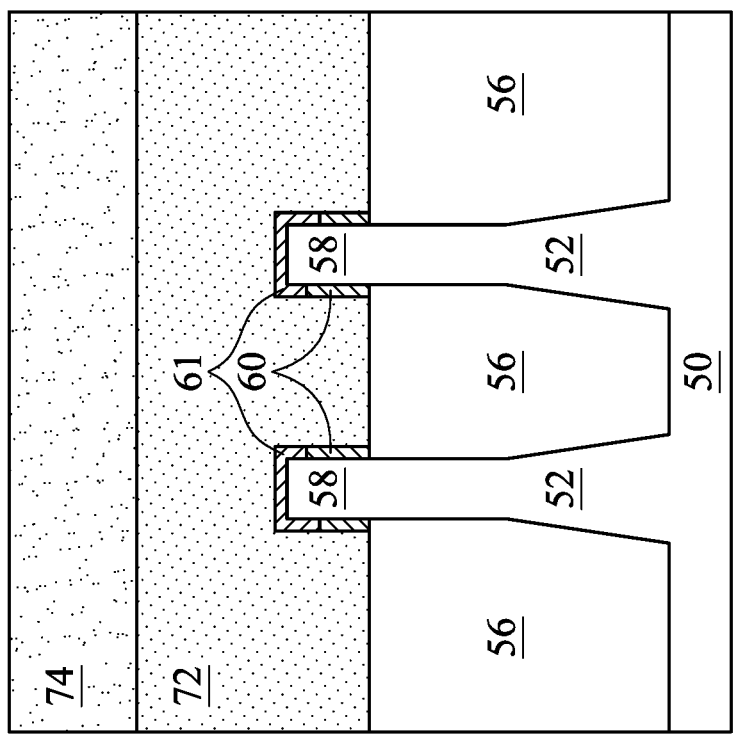

In FIGS. 14A and 14B, the mask layer 64 may be patterned using acceptable photolithography and etching techniques to form masks 74. The pattern of the masks 74 then may be transferred to the dummy gate layer 62 by an acceptable etching technique to form dummy gates 72. In some embodiments, the pattern of the masks 74 may also be transferred to the dummy dielectric layer 60 and/or the halogen-terminated dummy dielectric layer 61 (not separately illustrated). The dummy gates 72 cover respective channel regions of the fins 58. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52/58.

Further in FIGS. 14A and 14B, gate seal spacers 80 may be formed on exposed surfaces of the dummy gates 72, the masks 74, and/or the fins 58. A thermal oxidation or a deposition followed by an anisotropic etch may form the gate seal spacers 80.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the first region 50A, while exposing the second region 50B, and appropriate type (e.g., p-type) impurities may be implanted into the exposed fins 58 in the second region 50B. The mask may then be removed. Subsequently, a mask, such as a photoresist, may be formed over the second region 50B while exposing the first region 50A, and appropriate type (e.g., n-type) impurities may be implanted into the exposed fins 58 in the first region 50A. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

Figure 15B:
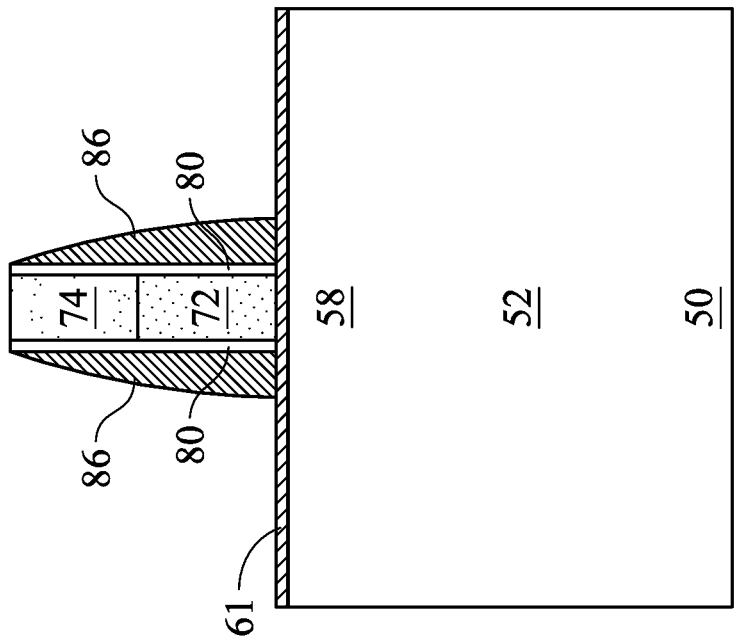
Figure 15A:
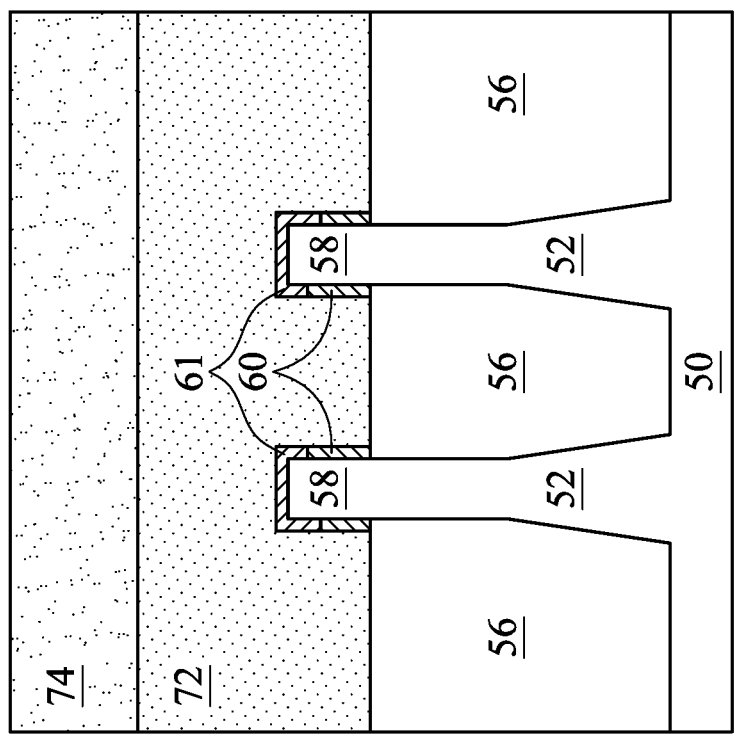

In FIGS. 15A and 15B, gate spacers 86 are formed on the gate seal spacers 80 along sidewalls of the dummy gates 72 and the masks 74. The gate spacers 86 may be formed by conformally depositing a material and subsequently anisotropically etching the material. The material of the gate spacers 86 may be silicon nitride, SiCN, a combination thereof, or the like.

Figure 16B:
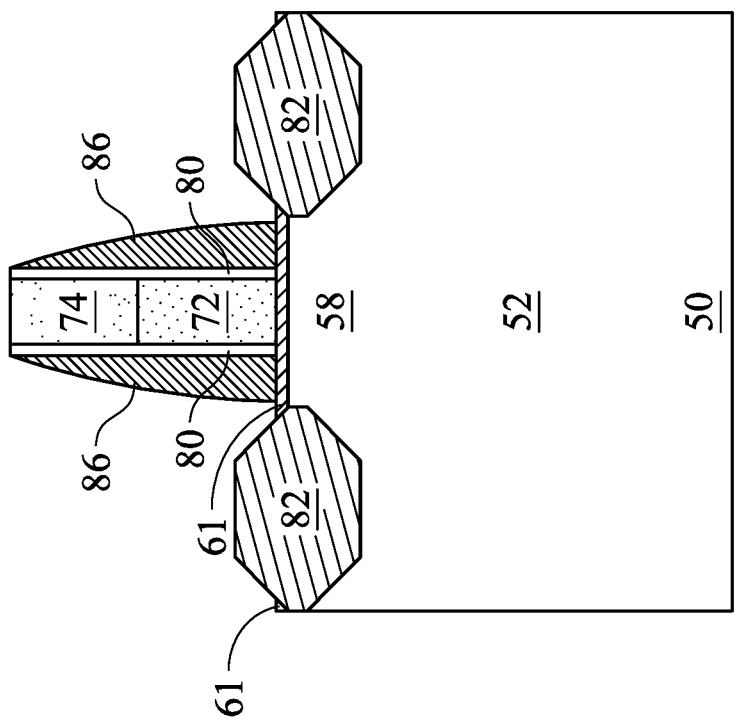
Figure 16A:
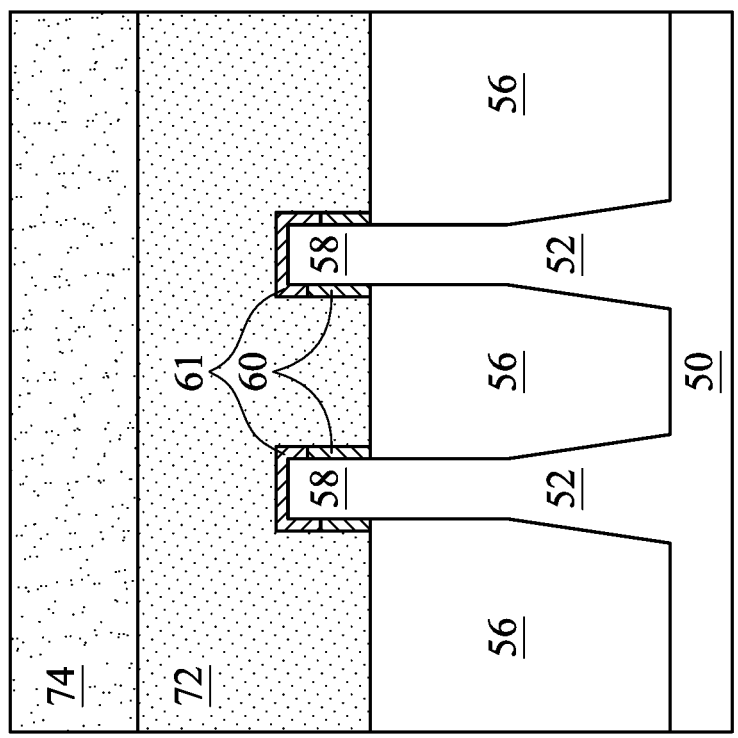
Figure 16C:
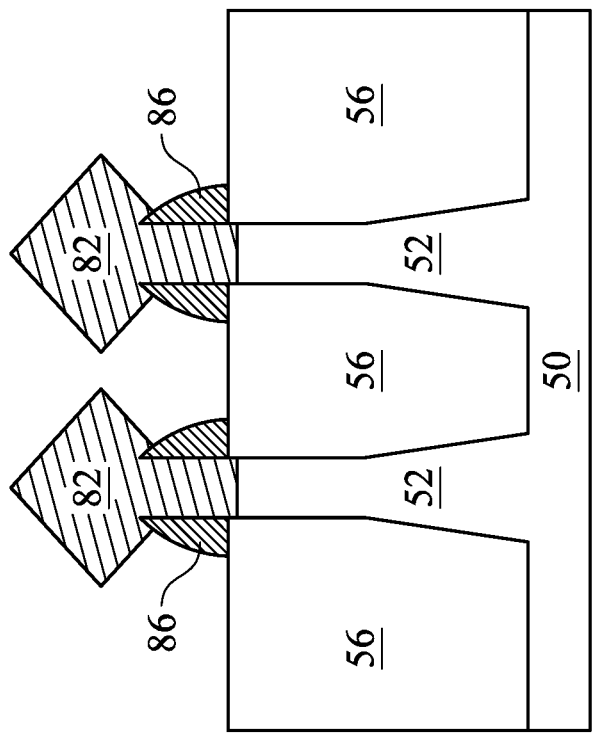
Figure 16D:
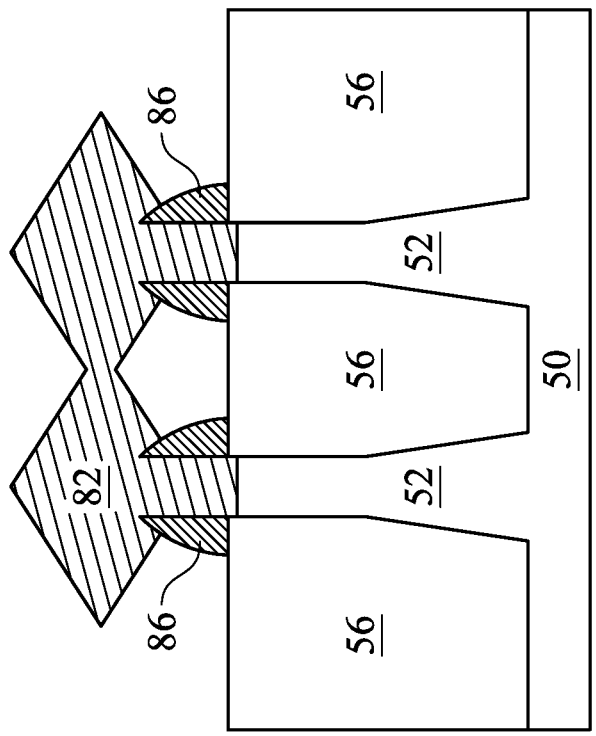

In FIGS. 16A and 16B epitaxial source/drain regions 82 are formed in the fins 58. The epitaxial source/drain regions 82 are formed in the fins 58 such that each dummy gate 72 is disposed between respective neighboring pairs of the epitaxial source/drain regions 82. In some embodiments that epitaxial source/drain regions 82 may extend into the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs.

The epitaxial source/drain regions 82 in the first region 50A, e.g., the NMOS region, may be formed by masking the second region 50B, e.g., the PMOS region, and etching source/drain regions of the fins 58 in the first region 50A form recesses in the fins 58. Then, the epitaxial source/drain regions 82 in the first region 50A are epitaxially grown in the recesses. The epitaxial source/drain regions 82 may include any acceptable material, such as appropriate for n-type FinFETs. For example, if the fin 58 is silicon, the epitaxial source/drain regions 82 in the first region 50A may include silicon, SiC, SiCP, SiP, or the like. The epitaxial source/drain regions 82 in the first region 50A may have surfaces raised from respective surfaces of the fins 58 and may have facets.

The epitaxial source/drain regions 82 in the second region 50B, e.g., the PMOS region, may be formed by masking the first region 50A, e.g., the NMOS region, and etching source/drain regions of the fins 58 in the second region 50B are etched to form recesses in the fins 58. Then, the epitaxial source/drain regions 82 in the second region 50B are epitaxially grown in the recesses. The epitaxial source/drain regions 82 may include any acceptable material, such as appropriate for p-type FinFETs. For example, if the fin 58 is silicon, the epitaxial source/drain regions 82 in the second region 50B may comprise SiGe, SiGeB, Ge, GeSn, or the like. The epitaxial source/drain regions 82 in the second region 50B may also have surfaces raised from respective surfaces of the fins 58 and may have facets.

The epitaxial source/drain regions 82 and/or the fins 58 may be implanted with dopants to form source/drain regions, similar to the process previously discussed for forming lightly doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the first region 50A and the second region 50B, upper surfaces of the epitaxial source/drain regions have facets which expand laterally outward beyond a sidewalls of the fins 58. In some embodiments, these facets cause adjacent source/drain regions 82 of a same finFET to merge as illustrated by FIG. 16C. In other embodiments, adjacent source/drain regions 82 remain separated after the epitaxy process is completed as illustrated by FIG. 16D.

In FIGS. 17A and 17B, an ILD 88 is deposited over the structure illustrated in FIGS. 16A and 16B. The ILD 88 may be formed of a dielectric material or a semiconductor material, and may be deposited by any suitable method, such as CVD, plasma-enhanced CVD (PECVD), or FCVD. Dielectric materials may include phosphosilicate glass (PSG), borosilicate glass (BSG), boron-doped phosphosilicate glass (BPSG), undoped silicate glass (USG), or the like. Semiconductor materials may include amorphous silicon (a-Si), silicon germanium ($Si_xGe_{1-x}$, where x may be between approximately 0 and 1), pure germanium, or the like. Other insulation or semiconductor materials formed by any acceptable process may be used. In some embodiments, a contact etch stop layer (CESL, not separately illustrated), is disposed between the ILD 88 and the epitaxial source/drain regions 82, the hard mask 74, and the gate spacers 86.

Figure 18A:
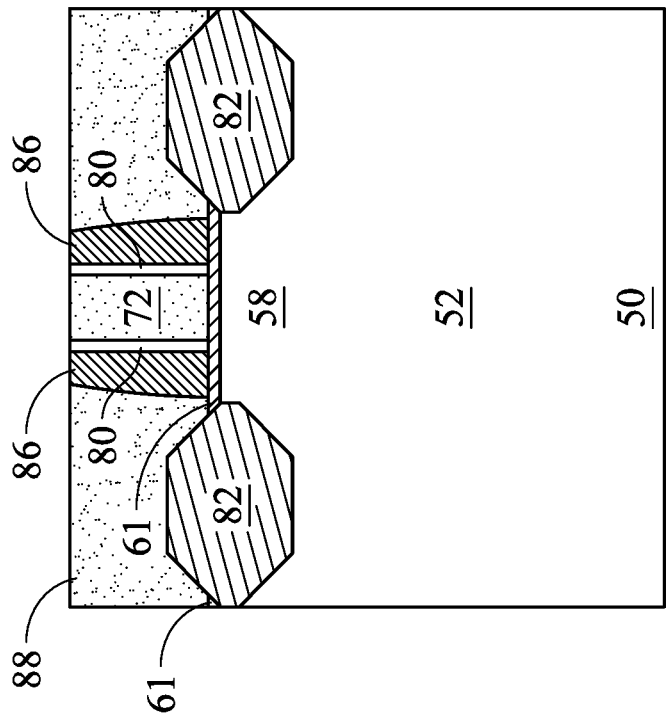
Figure 18B:
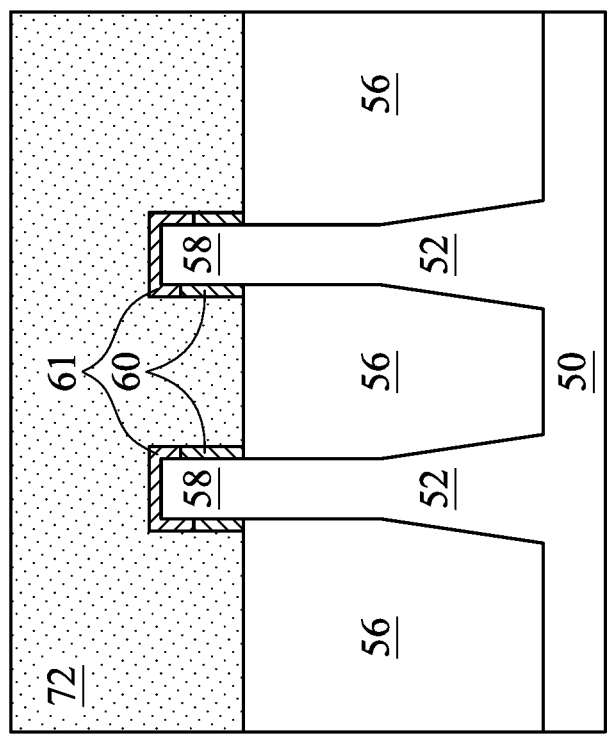

In FIGS. 18A and 18B, a planarization process, such as a CMP, may be performed to level the top surface of the ILD 88 with the top surfaces of the dummy gates 72. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the ILD 88 are level. Accordingly, the top surfaces of the dummy gates 72 are exposed through the ILD 88.

Figure 19B:
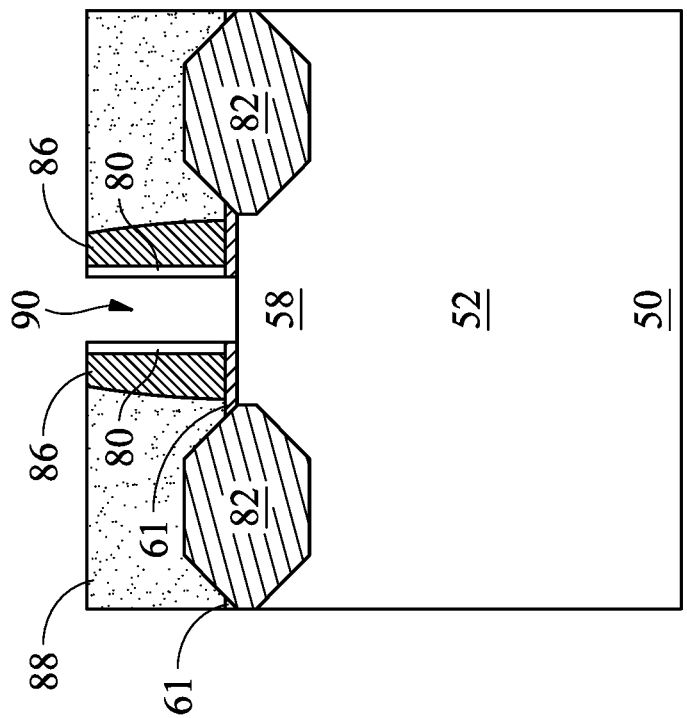
Figure 19A:
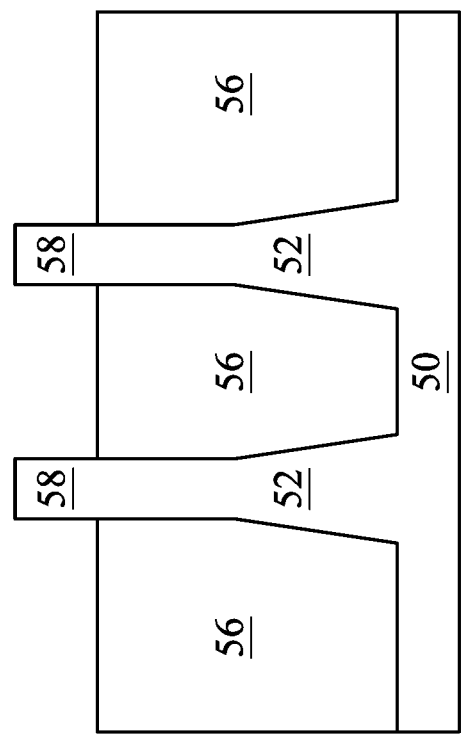

In FIGS. 19A and 19B, the dummy gates 72 and portions of the halogen-terminated dummy dielectric layer 61 directly underlying the exposed dummy gates 72 are removed in an etching step(s), so that recesses 90 are formed. In some embodiments, the dummy gates 72 are removed by an anisotropic dry etch process. For example, the etching process may include a dry etch process using reaction gas(es) that selectively etch the dummy gates 72 without etching the ILD 88 or the gate spacers 86. Each recess 90 exposes a channel region of a respective fin 58. Each channel region is disposed between neighboring pairs of the epitaxial source/drain regions 82. During the removal, the halogen-terminated dummy dielectric layer 61 may be used as an etch stop layer when the dummy gates 72 are etched. The halogen-terminated dummy dielectric layer 61 may then be removed after the removal of the dummy gates 72.

Figure 20B:
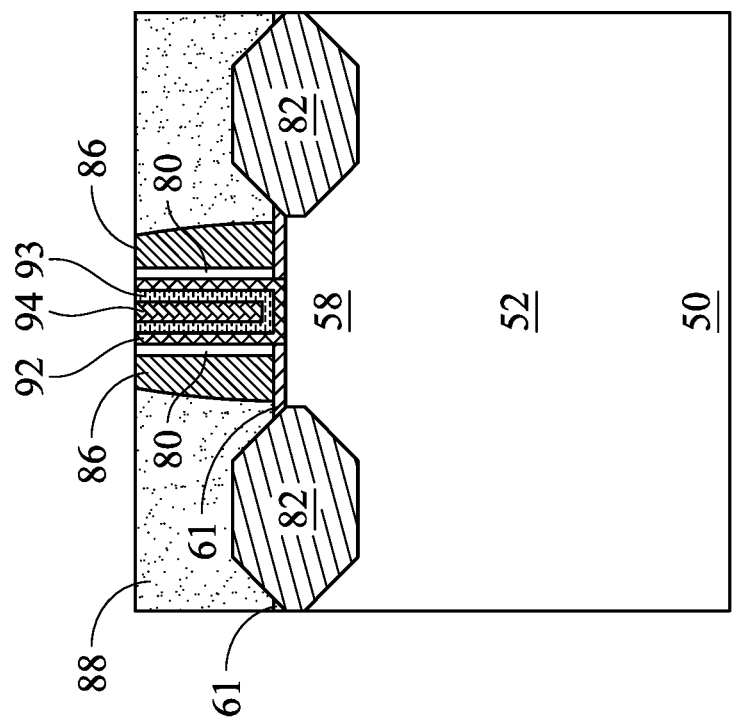
Figure 20A:
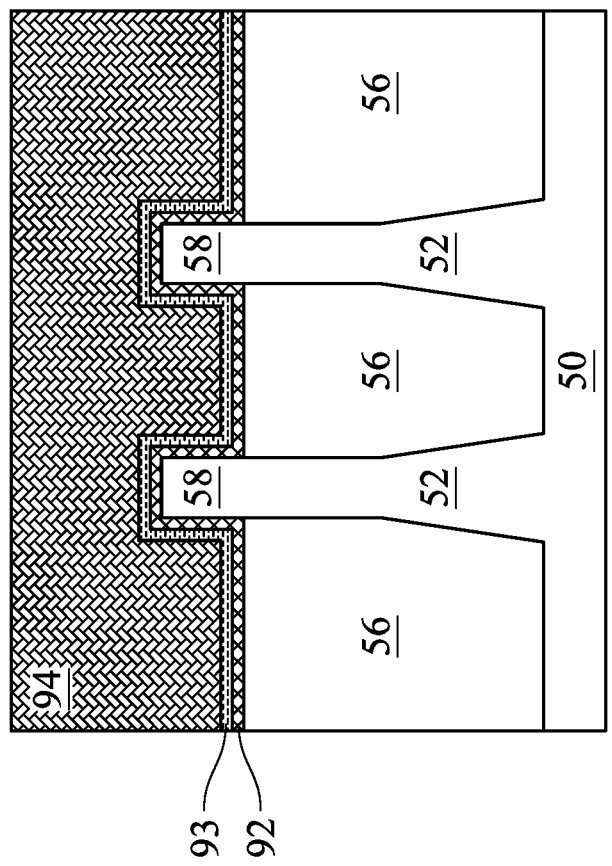

In FIGS. 20A and 20B, a gate dielectric layer 92, a work function layer 93, and gate electrodes 94 are formed for replacement gates. The gate dielectric layer 92 is deposited conformally in the recesses 90, such as on the top surfaces and the sidewalls of the fins 58 and on sidewalls of the gate seal spacers 80/gate spacers 86. The gate dielectric layer 92 may also be formed on top surface of the ILD 88. In accordance with some embodiments, the gate dielectric layer 92 comprises silicon oxide ($SiO_2$), silicon nitride ($Si_3N_4$), or multilayers thereof. In some embodiments, the gate dielectric layer 92 is a high-k dielectric material, and in these embodiments, the gate dielectric layer 92 may have a k value greater than about 7.0, and may include a metal oxide or a silicate of Hf, Al, Zr, La, Mg, Ba, Ti, Pb, and combinations thereof. The formation methods of the gate dielectric layer 92 may include molecular beam deposition (MBD), ALD, PECVD, and the like.

Further in FIGS. 20A and 20B, conductive material is formed to fill the recesses 90. The conductive material may include one or more barrier layers, work function layers, and/or work function tuning layers to tune the work function of the subsequently formed gate electrodes. In an embodiment, the work function layer 93 is deposited over the gate dielectric layer 92. The work function layer 93 may be a metal-containing material such as Al, TiC, TiN, combinations thereof, or multi-layers thereof.

The gate electrodes 94 are deposited over the work function layer 93 and fill the remaining portions of the recesses 90. The gate electrodes 94 may be a metal-containing material such as TiN, TaN, TaC, Co, Ru, Al, combinations thereof, or multi-layers thereof. After the filling of the gate electrodes 94, a planarization process, such as a CMP, may be performed to remove the excess portions of the gate dielectric layer 92, the work function layer 93, and the gate electrodes 94, which excess portions are over the top surface of the ILD 88. The remaining portions of the gate electrodes 94, the work function layer 93, and the gate dielectric layer 92 thus form replacement gates of the resulting FinFETs. The gate electrodes 94, the work function layer 93, and the gate dielectric layer 92 may be collectively referred to as a "gate" or a "gate stack." The gate and the gate stacks may extend along sidewalls of a channel region of the fins 58.

The formation of the gate dielectric layer 92 in the first region 50A and the second region 50B may occur simultaneously such that the gate dielectric layer 92 in each region are formed from the same materials. Similarly, the formation of the work function layer 93 and the formation of the gate electrodes 94 in the first region 50A and the second region 50B may each occur simultaneously such that the work function layer 93 and the gate electrodes 94 in each region are formed from the same materials as the work function layer 93 and the gate electrodes 94 in the other region. In some embodiments, the gate dielectric layers 92, the work function layers 93, and the gate electrodes 94 in each region may be formed by distinct processes, such that the gate dielectric layers 92, the work function layers 93, and the gate electrodes 94 in each region may be different materials. Various masking steps may be used to mask and expose appropriate regions when using distinct processes.

Figure 21B:
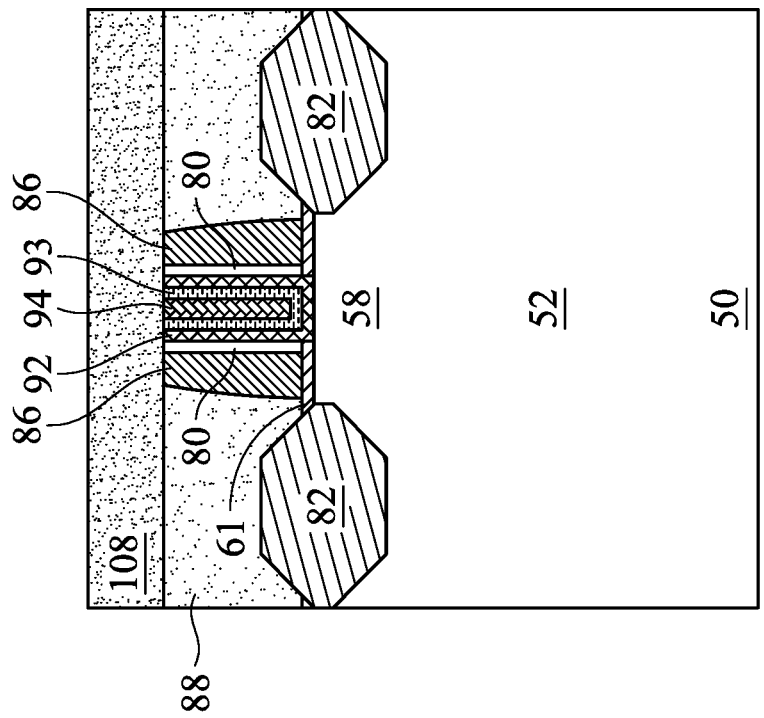
Figure 21A:
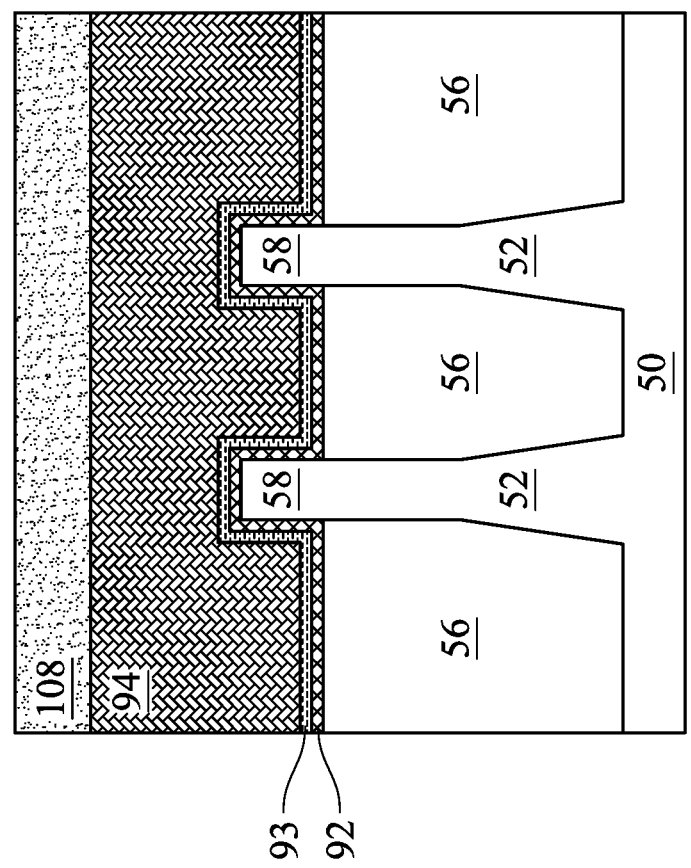

In FIGS. 21A and 21B, an ILD 108 is deposited over the ILD 88. In an embodiment, the ILD 108 is a flowable film formed by a flowable CVD method. In some embodiments, the ILD 108 is formed of a dielectric material such as PSG, BSG, BPSG, USG, or the like, and may be deposited by any suitable method, such as CVD and PECVD.

Figure 22B:
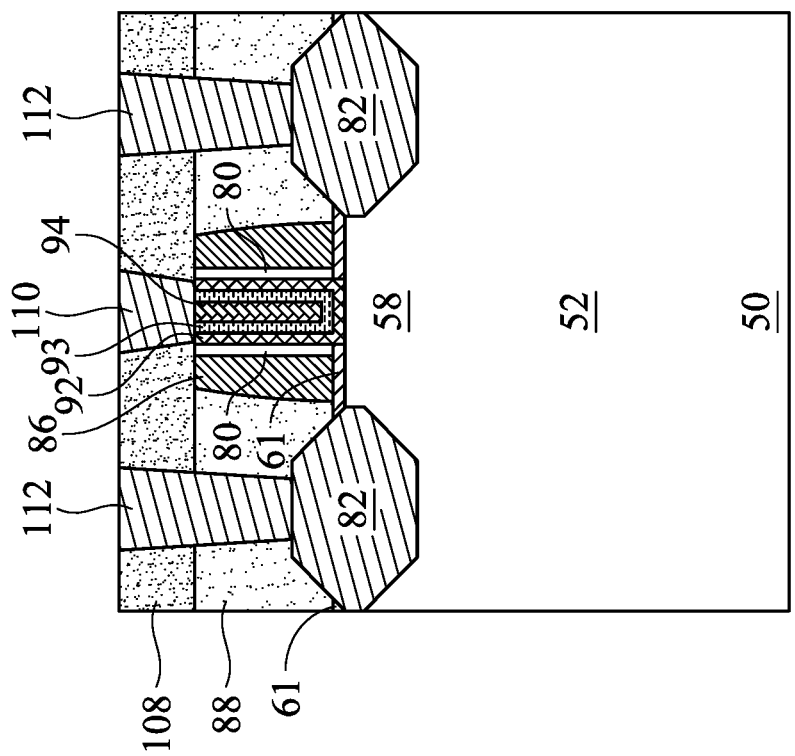
Figure 22A:
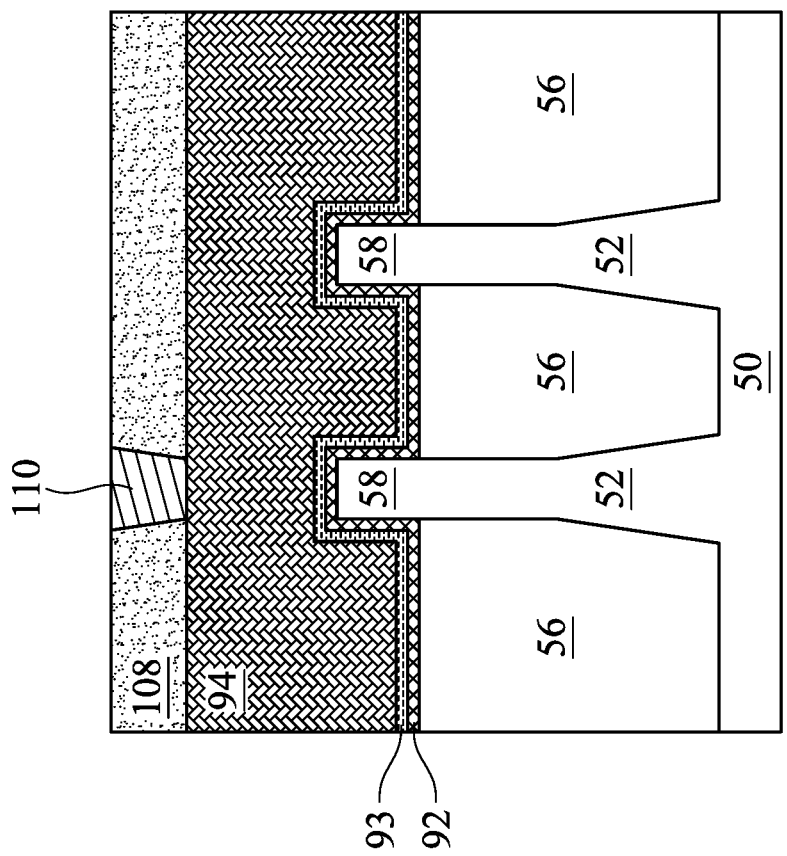
Figure 23:
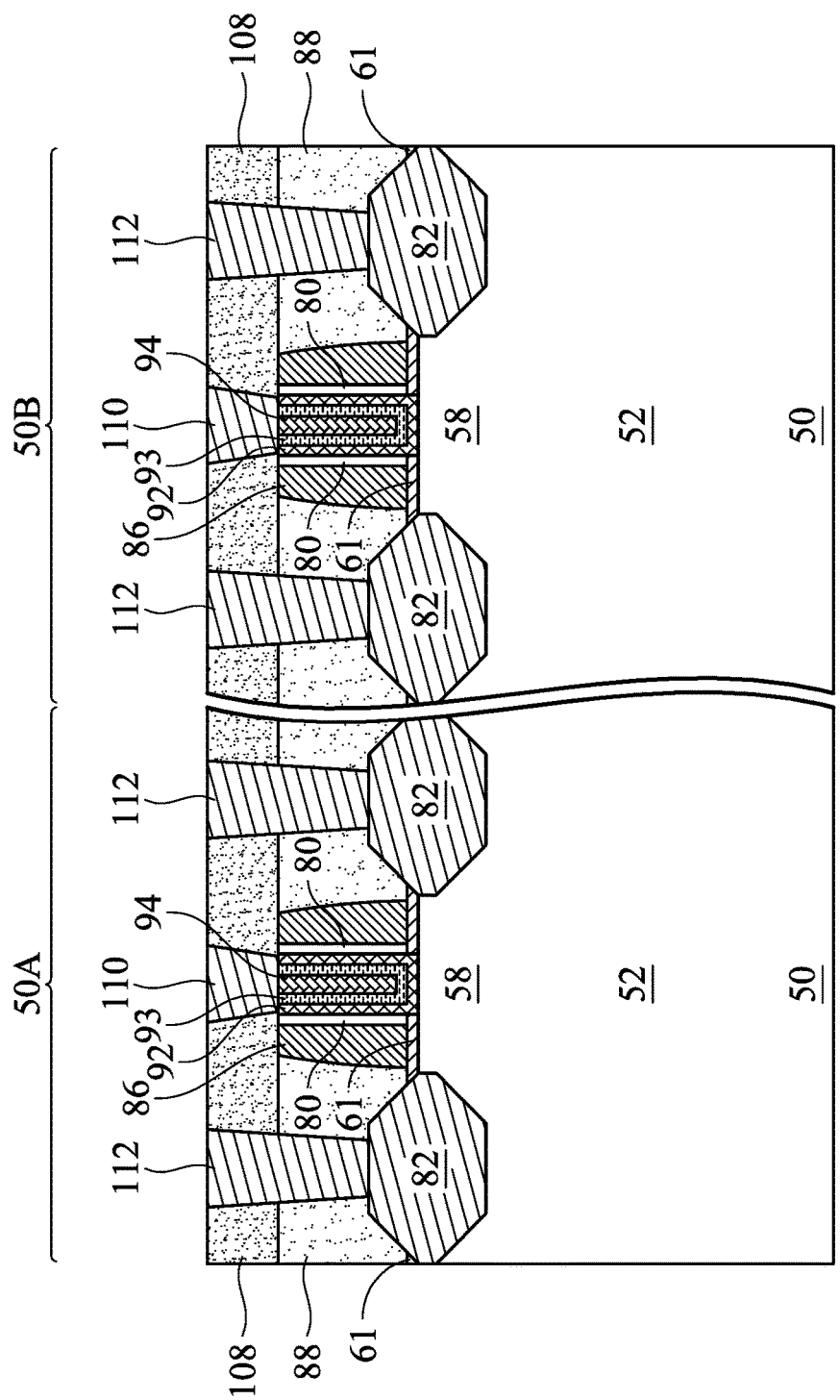

In FIGS. 22A and 22B, a gate contact 110 and source/drain contacts 112 are formed through the ILD 108 and the ILD 88. Openings for the source/drain contacts 112 (not separately illustrated) are formed through the ILD 108 and the ILD 88, and openings for the gate contact 110 (not separately illustrated) are formed through the ILD 108. The openings may be formed using acceptable photolithography and etching techniques. Optionally, prior to formation of the gate contact 110 and the source/drain contacts 112, a silicide contact (not separately illustrated) may be formed. The silicide contact may comprise titanium, nickel, cobalt, or erbium, and may be used to reduce the Schottky barrier height of the gate contact 110 and the source/drain contacts 112. However, other metals, such as platinum, palladium, and the like, may also be used. The silicidation may be performed by blanket deposition of an appropriate metal layer, followed by an annealing step which causes the metal to react with the underlying exposed silicon. Un-reacted metal is then removed, such as with a selective etch process. The thickness of the silicide contact may be between about 5 nm and about 50 nm.

The gate contact 110 and the source/drain contacts 112 may be formed of conductive materials such as Al, Cu, W, Co, Ti, Ta, Ru, TiN, TiAl, TiAlN, TaN, TaC, NiSi, CoSi, combinations of these, or the like, although any suitable material may be used. The material of the gate contact 110 and the source/drain contacts 112 may be deposited into the openings in the ILD 108 and the ILD 88 using a deposition process such as sputtering, chemical vapor deposition, electroplating, electroless plating, or the like, to fill and/or overfill the openings. Once filled or overfilled, any deposited material outside of the openings may be removed using a planarization process such as chemical mechanical polishing (CMP).

The gate contact 110 is physically and electrically connected to the gate electrode 94, and the source/drain contacts 112 are physically and electrically connected to the epitaxial source/drain regions 82. FIGS. 22A and 22B illustrate the gate contact 110 and the source/drain contacts 112 in a same cross-section; however, in other embodiments, the gate contact 110 and the source/drain contacts 112 may be disposed in different cross-sections. Further, the position of the gate contact 110 and the source/drain contacts 112 in FIGS. 22A and 22B are merely illustrative and not intended to be limiting in any way. For example, the gate contact 110 may be vertically aligned with the fin 52 as illustrated or may be disposed at a different location on the gate electrode 94. Furthermore, the source/drain contacts 112 may be formed prior to, simultaneously with, or after forming the gate contacts 110. As illustrated in FIGS. 22A and 22B, at least a portion of the halogen-terminated dummy dielectric layer 61 may remain on the fin 58.

FIG. 23 illustrates a FinFET device in the first region 50A and a FinFET device in the second region 50B. As illustrated in FIG. 23, the FinFET devices in the first region 50A and the second region 50B the same or similar to one another and may each be formed by the steps discussed above in reference to FIGS. 14A through 22B. The FinFET devices in the first region 50A may be formed simultaneously with the FinFET devices in the second region, or separately from the FinFET devices in the second region.

Many transistors may be formed across the surface of the substrate 50. In some embodiments, the bottom-up process described above may be used to form transistors in some regions of the substrate 50, and conventional processes may be used to form transistors in other regions of the substrate 50. As a result, only the regions including transistors formed by the bottom-up process may experience the benefits of the bottom-up process, and the halogen-terminated dummy dielectric layer 61 may only be present in the regions in which transistors are formed by the bottom-up process. The regions including transistors formed by conventional process may include conventional dummy dielectric layers, which are not halogen-terminated.

Forming the dummy gate layer 62 according to the bottom-up process described above results in several advantages. For example, the bottom-up process reduces bending of the fins 58. This process also prevents seams or voids from being formed in the dummy gate layer 62. As a result, the dummy gate layer 62 may be completely removed before forming the gate stack without leaving any residue or residual material. This leads to improved device performance as well as increased device yield.

In accordance with an embodiment, a method includes depositing a dummy dielectric layer on a fin extending from a substrate; depositing a dummy gate seed layer on the dummy dielectric layer; reflowing the dummy gate seed layer; etching the dummy gate seed layer; and selectively depositing a dummy gate material over the dummy gate seed layer, the dummy gate material and the dummy gate seed layer forming a dummy gate. In an embodiment, etching the dummy gate seed layer exposes a portion of the dummy dielectric layer. In an embodiment, etching the dummy gate seed layer forms a terminated surface on the dummy dielectric layer in the exposed portion of the dummy dielectric layer. In an embodiment, the dummy gate material is deposited at a first rate on the dummy gate seed layer, the dummy gate material is deposited at a second rate on the terminated surface of the dummy dielectric layer, and the first rate is greater than the second rate. In an embodiment, the method further includes removing the dummy gate to form a recess; and forming a replacement gate in the recess. In an embodiment, removing the dummy gate further includes removing at least a portion of the dummy dielectric layer, and another portion of the dummy dielectric layer including the terminated surface remains after removing the dummy gate. In an embodiment, etching the dummy gate seed layer includes a halogen-based plasma etch. In an embodiment, the dummy gate seed layer has a hydrogen concentration of less than $2\times10^{20}$ atoms/cm$^3$ after the reflowing the dummy gate seed layer. In an embodiment, the dummy gate seed layer is deposited by atomic layer deposition (ALD) or chemical vapor deposition (CVD). In an embodiment, the dummy gate includes amorphous silicon (a-Si). In an embodiment, the dummy gate seed layer is reflowed at a temperature greater than 470° C. for a time greater than three minutes and at a pressure of less than 100 Torr.

In accordance with another embodiment, a method includes depositing a dummy dielectric layer on a fin extending from a substrate; depositing a first dummy gate material on the dummy dielectric layer; reflowing the first dummy gate material; etching the first dummy gate material and the dummy dielectric layer, the etching the dummy dielectric layer forming a terminated dummy dielectric layer; and depositing a second dummy gate material over the first dummy gate material to form a dummy gate, the second dummy gate material being selectively deposited on the first dummy gate material. In an embodiment, the method further includes etching the dummy gate and the dummy dielectric layer to form a recess, at least a portion of the terminated dummy dielectric layer remaining after etching the dummy gate and the dummy dielectric layer; and forming a gate stack in the recess. In an embodiment, the etching includes a halogen-based gas etching. In an embodiment, a surface of the dummy dielectric layer is exposed by the etching the first dummy gate material and the exposed surface of the dummy dielectric layer is terminated by the etching to form the terminated dummy dielectric layer. In an embodiment, the substrate includes a plurality of fins, and a variation in a fin-to-fin spacing of the plurality of fins is less than 6 nm after forming the dummy gate.

In accordance with yet another embodiment, a semiconductor device includes a gate stack over a semiconductor substrate; a gate spacer disposed on sidewalls of the gate stack; and a dielectric layer disposed between the semiconductor substrate and the gate spacer, the dielectric layer including a halogen-terminated surface. In an embodiment, the halogen-terminated surface includes chlorine-terminated silicon dioxide. In an embodiment, the semiconductor substrate includes one or more fins. In an embodiment, the semiconductor device further includes a second gate stack over the semiconductor substrate; a second gate spacer disposed on sidewalls of the second gate stack; and a second dielectric layer disposed between the semiconductor substrate and the second gate spacer, the second dielectric layer being not halogen-terminated.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   depositing a dummy dielectric layer on a fin extending from a substrate;
   depositing a dummy gate seed layer on the dummy dielectric layer;
   reflowing the dummy gate seed layer, wherein reflowing the dummy gate seed layer decreases a thickness of the dummy gate seed layer on a top surface of the fin and increases a thickness of the dummy gate seed layer adjacent the fin;
   etching the dummy gate seed layer; and
   selectively depositing a dummy gate material over the dummy gate seed layer, wherein the dummy gate material and the dummy gate seed layer comprise a dummy gate.

2. The method of claim 1, wherein etching the dummy gate seed layer exposes a portion of the dummy dielectric layer.

3. The method of claim 2, wherein etching the dummy gate seed layer forms a terminated surface on the dummy dielectric layer in the exposed portion of the dummy dielectric layer.

4. The method of claim 3, wherein the dummy gate material is deposited at a first rate on the dummy gate seed layer, wherein the dummy gate material is deposited at a second rate on the terminated surface of the dummy dielectric layer, and wherein the first rate is greater than the second rate.

5. The method of claim 3, further comprising removing the dummy gate to form a recess; and
   forming a replacement gate in the recess.

6. The method of claim 5, wherein removing the dummy gate further comprises removing at least a portion of the dummy dielectric layer, and wherein another portion of the dummy dielectric layer including the terminated surface remains after removing the dummy gate.

7. The method of claim 1, wherein etching the dummy gate seed layer comprises a halogen-based plasma etch.

8. The method of claim 1, wherein the dummy gate seed layer has a hydrogen concentration of less than $2\times10^{20}$ atoms/cm$^3$ after the reflowing the dummy gate seed layer.

9. The method of claim 1, wherein the dummy gate seed layer is deposited by atomic layer deposition (ALD) or chemical vapor deposition (CVD).

10. The method of claim 1, wherein the dummy gate comprises amorphous silicon (a-Si).

11. The method of claim 1, wherein the dummy gate seed layer is reflowed at a temperature greater than 470° C. for a time greater than three minutes and at a pressure of less than 100 Torr.

12. A method comprising:
    depositing a dummy dielectric layer on a fin extending from a substrate;
    depositing a first dummy gate material on the dummy dielectric layer;
    reflowing the first dummy gate material, wherein reflowing the first dummy gate material causes material of the first dummy gate material to flow from above the fin to a trench adjacent the fin;
    etching the first dummy gate material and the dummy dielectric layer, wherein etching the dummy dielectric layer forms a terminated dummy dielectric layer; and
    after etching the first dummy gate material and the dummy dielectric layer, depositing a second dummy gate material over the first dummy gate material to form a dummy gate, wherein the second dummy gate material is selectively deposited on the first dummy gate material.

13. The method of claim 12, further comprising:
etching the dummy gate and the dummy dielectric layer to form a recess, at least a portion of the terminated dummy dielectric layer remaining after etching the dummy gate and the dummy dielectric layer; and
forming a gate stack in the recess.

14. The method of claim 12, wherein the etching comprises a halogen-based gas etching.

15. The method of claim 12, wherein a surface of the dummy dielectric layer is exposed by the etching the first dummy gate material and wherein the exposed surface of the dummy dielectric layer is terminated by the etching to form the terminated dummy dielectric layer.

16. The method of claim 12, wherein the substrate comprises a plurality of fins, and wherein a variation in a fin-to-fin spacing of the plurality of fins is less than 6 nm after forming the dummy gate.

17. A method of forming a semiconductor device comprising:
depositing a dielectric layer over a semiconductor substrate;
etching a first portion of the dielectric layer, wherein etching the dielectric layer forms a halogen-terminated surface in the first portion of the dielectric layer, wherein a second portion of the dielectric layer is not etched, and wherein the second portion of the dielectric layer is free from the halogen-terminated surface;
forming a gate stack over the dielectric layer; and
forming a gate spacer disposed on sidewalls of the gate stack, wherein the dielectric layer is disposed between the semiconductor substrate and the gate spacer.

18. The method of claim 17, wherein the dielectric layer is etched with an etchant gas including chlorine, and wherein the halogen-terminated surface comprises chlorine-terminated silicon dioxide.

19. The method of claim 17, further comprising forming one or more fins in the semiconductor substrate.

20. The method of claim 17, wherein the method further comprises:
forming a second gate stack over the second portion of the dielectric layer; and
forming a second gate spacer disposed on sidewalls of the second gate stack, wherein the second portion of the dielectric layer is disposed between the semiconductor substrate and the second gate spacer.

* * * * *